(12) United States Patent  (10) Patent No.: US 9,281,304 B2
Nandakumar et al.  (45) Date of Patent: Mar. 8, 2016

(54) TRANSISTOR ASSISTED ESD DIODE

(71) Applicant: Texas Instruments Incorporated, Dallas, TX (US)

(72) Inventors: Mahalingam Nandakumar, Richardson, TX (US); Sunitha Venkataraman, Dallas, TX (US); David L. Catlett, Jr., Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/709,696

(22) Filed: Dec. 10, 2012

(65) Prior Publication Data

US 2013/0146978 A1  Jun. 13, 2013

Related U.S. Application Data

(60) Provisional application No. 61/568,426, filed on Dec. 8, 2011.

(51) Int. Cl.
H01L 23/62 (2006.01)
H01L 27/02 (2006.01)

(52) U.S. Cl.
CPC ........ H01L 27/0259 (2013.01); H01L 27/0274 (2013.01)

(58) Field of Classification Search
CPC ............ H01L 27/0255; H01L 27/0266; H01L 27/0251; H01L 27/0259; H01L 27/0262; H01L 27/0248; H01L 29/66121; H01L 29/7808; H01L 23/62; H01L 27/0921; H01L 29/7391; H01L 29/7821; H01L 27/0274
See application file for complete search history.

(56) References Cited

U.S. PATENT DOCUMENTS

2005/0285187 A1* 12/2005 Bryant et al. ................. 257/335
2006/0289935 A1* 12/2006 Yu ....................... H01L 27/0266
257/355
2013/0026576 A1* 1/2013 Stockinger .................... 257/355

* cited by examiner

*Primary Examiner* — Amar Movva
*Assistant Examiner* — Cory Eskridge
(74) *Attorney, Agent, or Firm* — Jacqueline J. Garner; Frank D. Cimino

(57) ABSTRACT

An integrated circuit includes a diode/bipolar ESD protection device. The diode/bipolar ESD device includes at least one gate separated ESD diode and at least one gate spaced ESD bipolar transistor coupled in parallel between a fixed voltage and an input/output pin.

28 Claims, 24 Drawing Sheets

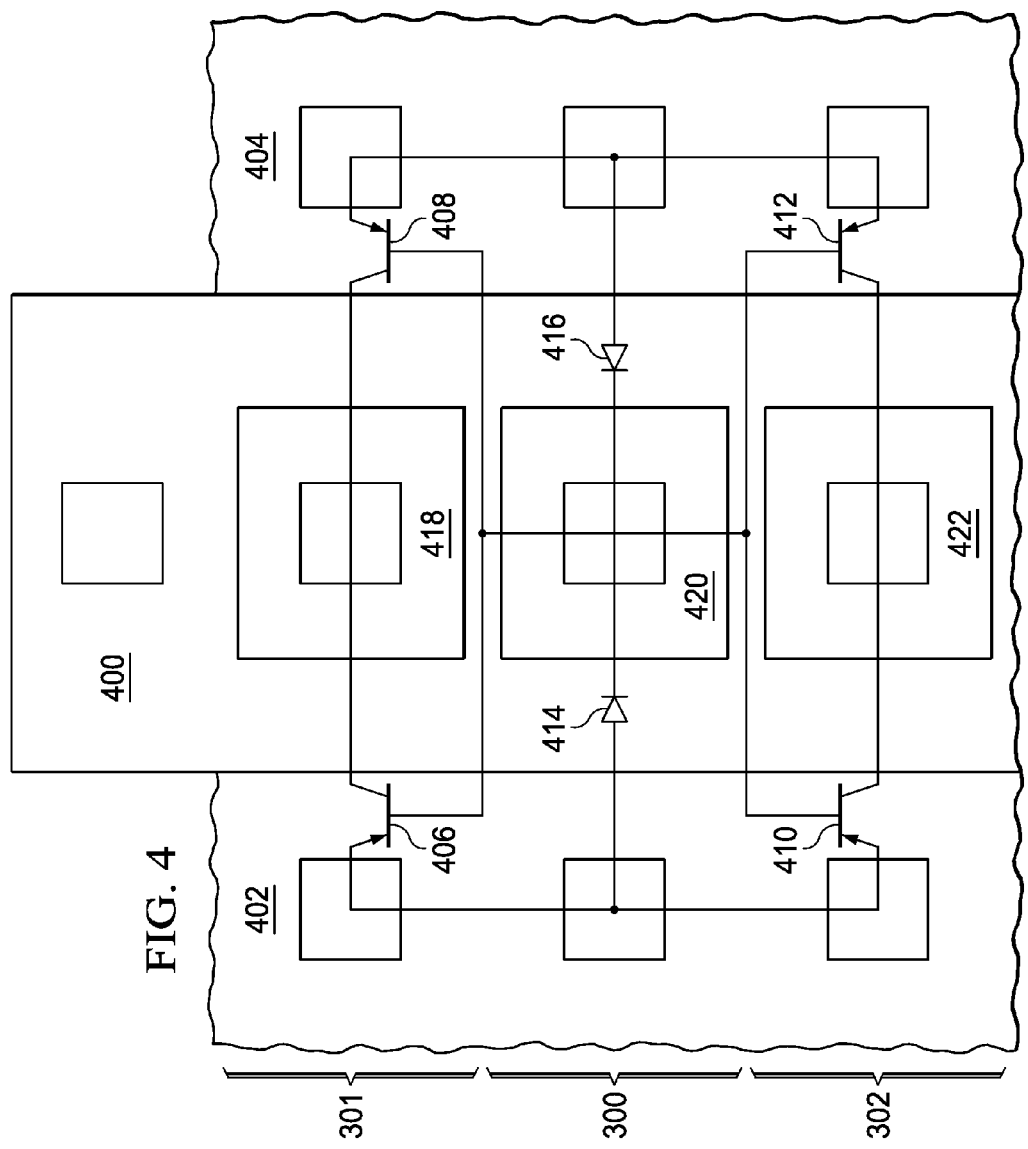

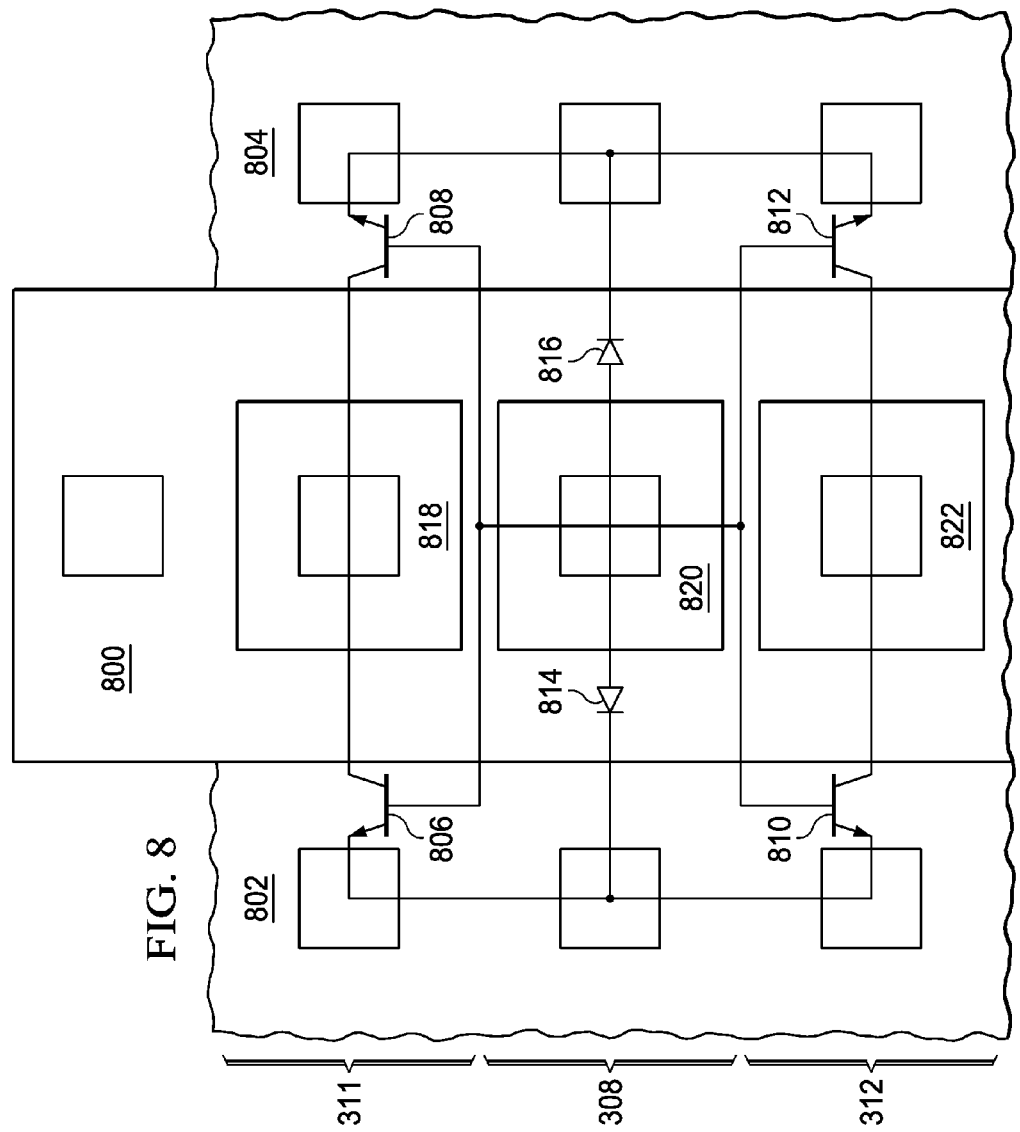

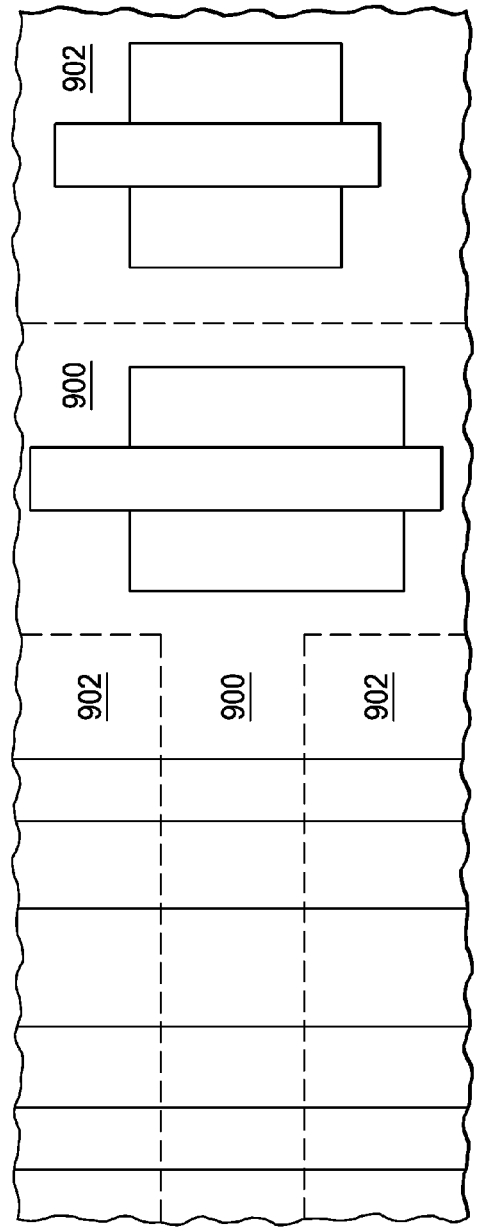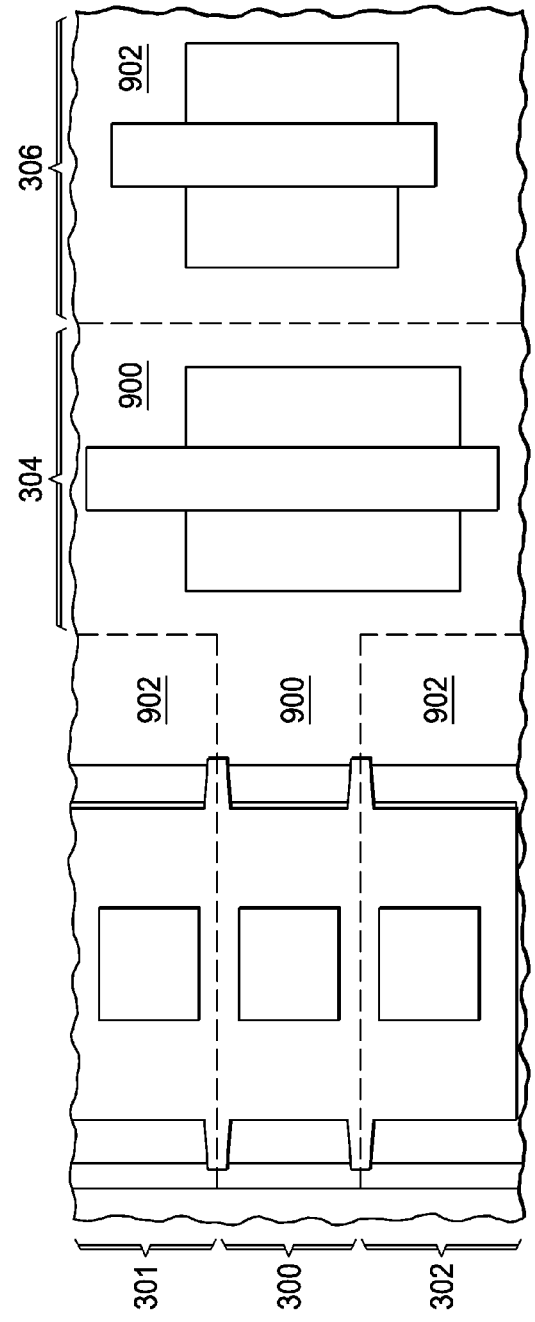

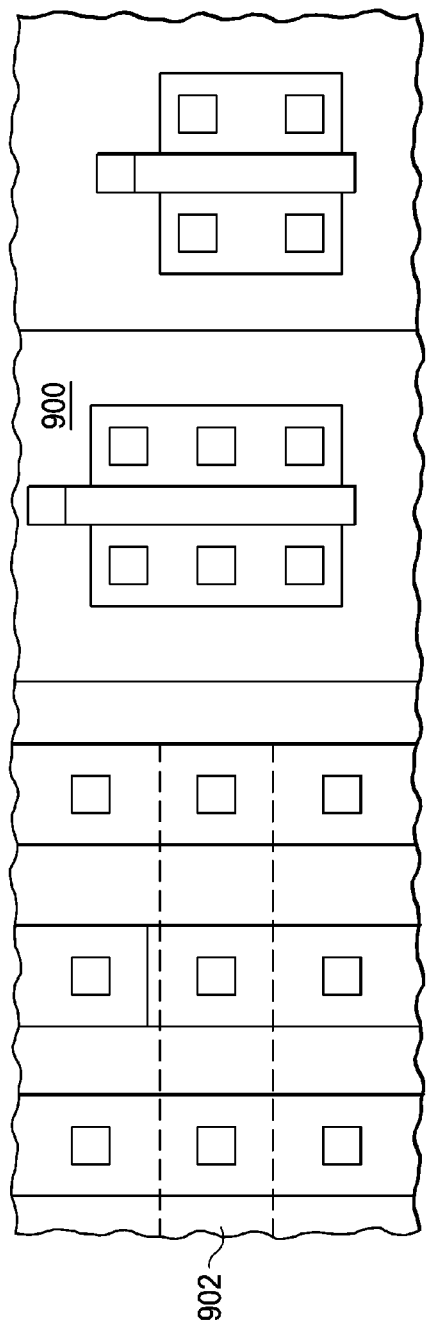
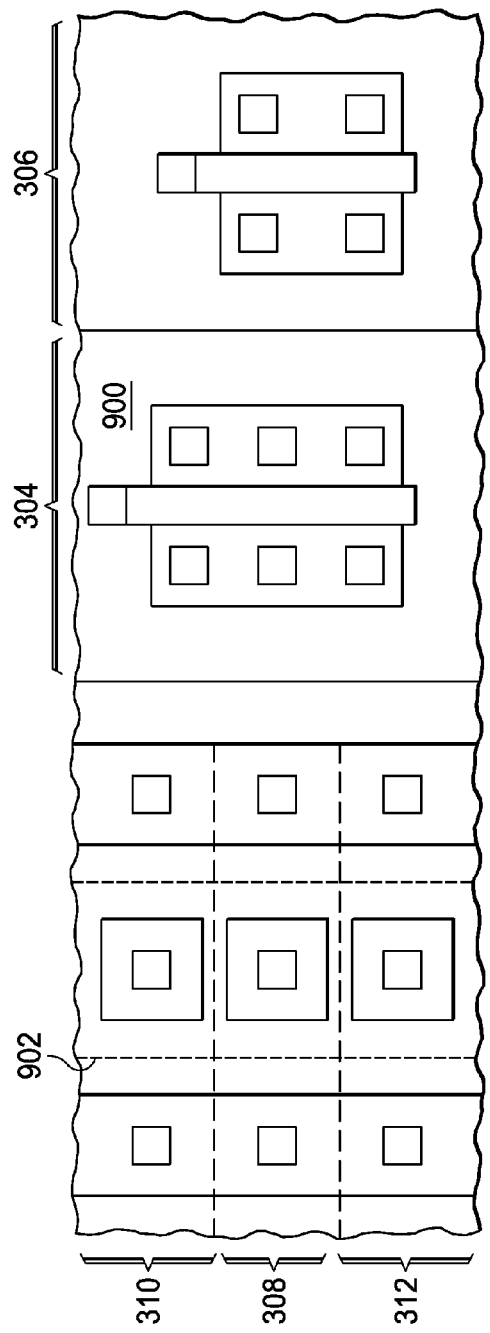

TRANSISTOR ASSISTED ESD DIODE

This application claims the benefit of priority under U.S.C. §119(e) of U.S. Provisional Application 61/568,426, filed Dec. 8, 2011).

This invention relates to the field of integrated circuits. More particularly, this invention relates to ESD protection diodes in integrated circuits.

BACKGROUND

Electrostatic discharge (ESD) is a continuing problem in the design, manufacture, and utilization of integrated circuits (ICs). A major source of ESD exposure to ICs is from the human body (described by the "Human Body Model", HBM). In this situation, a packaged IC acquires a charge when it is touched by a human who is electrostatically charged (e.g. from walking across a carpet). A charge of about 0.4 uC may be induced on a body capacitance of 100 pF, for example, leading to an electrostatic potential of 4 kV or more and discharge peak currents of several amperes to the IC for longer than 100 ns. A second source of ESD exposure is from charged metallic objects (described by the "Machine Model", MM), which is characterized by a greater capacitance, lower internal resistance and transients that have significantly higher peak current levels than a HBM ESD source. A third source of ESD exposure is due to the discharge of stored charge on the integrated circuit itself (described by the "Charged Device Model", CDM), to ground with rise times of less than 500 ps. The current flow during CDM is in the opposite direction of the HBM and MM ESD sources. For all three sources of ESD exposure, both positive and negative polarity discharges may occur.

Shallow trench isolation (STI) spaced diodes in which an N+ to pwell diode is isolated from a pwell contact by STI is one type of ESD protection diode commonly used for the protection of integrated circuits during ESD strikes. The anode (pwell contact) is connected to Vss or ground and the cathode (N+ diffusion) is connected to an input/output (I/O) pin. During an ESD strike on the I/O pin the N+/pwell diode becomes forward biased shorting the ESD current to ground. Because the path length of the ESD current is long, the turn on time of this ESD diode is sometimes slower than the rise time of the ESD current pulse. This results in voltage overshoot before the STI ESD protection diode turns on. This voltage overshoot may damage the integrated circuit.

A gate spaced PN ESD protection diode in which a transistor gate which is shorted to the anode (pwell contact) electrically isolates an N+ to pwell diode from the pwell contact may be used to avoid voltage overshoot. The current path of the gate spaced ESD protection diode is significantly shorter than the STI spaced diodes so the turn on time is significantly faster. An issue with the gate spaced ESD protection diode is higher capacitance than the STI spaced diode which degrades integrated circuit performance at high frequency.

A gate spaced NP ESD protection diode in which a transistor gate which is shorted to the cathode (nwell contact) electrically isolates a P+ to nwell diode from the nwell contact may be used to short ESD current on I/O pins to Vdd to protect the integrated circuit from damage.

After an ESD strike time is required for the ESD diode to reform the reverse biased depletion region. This recovery time limits high frequency performance of the gate spaced ESD protection diode and the high frequency performance of the integrated circuit.

It is desired to have ESD circuit protection with fast turn-on to avoid voltage overshoot and low capacitance along with fast recovery time to avoid circuit performance degradation at high frequencies.

SUMMARY

An integrated circuit with a diode/bipolar ESD protection device. An integrated circuit with a diode/bipolar ESD protection device with a diode/bipolar ESD device consisting of at least one gate separated ESD diode and at least one gate spaced ESD bipolar transistor coupled in parallel between a fixed voltage and an input/output pin.

BRIEF DESCRIPTION OF THE DRAWINGS

FIG. 4 is a plan view of an embodiment of an PN/PNP ESD device according to principles of the invention.

FIG. 8 is a plan view of an embodiment of an NP/NPN ESD device according to principles of the invention.

FIGS. 9A and 9B are plan views of an embodiment of an PN/PNP ESD devices according to principles of the invention.

FIGS. 10A and 10B are plan views of embodiments of NP/NPN ESD devices according to principles of the invention.

DETAILED DESCRIPTION OF EXAMPLE EMBODIMENTS

Embodiments of gate spaced ESD diode/gate spaced bipolar ESD protection devices (GS ESD diode/GS bipolar ESD devices or ESD diode/bipolar ESD devices) with fast response time and fast recovery time are illustrated in FIGS. 1A, 1B, 2A, and 2B.

Figure 1A:
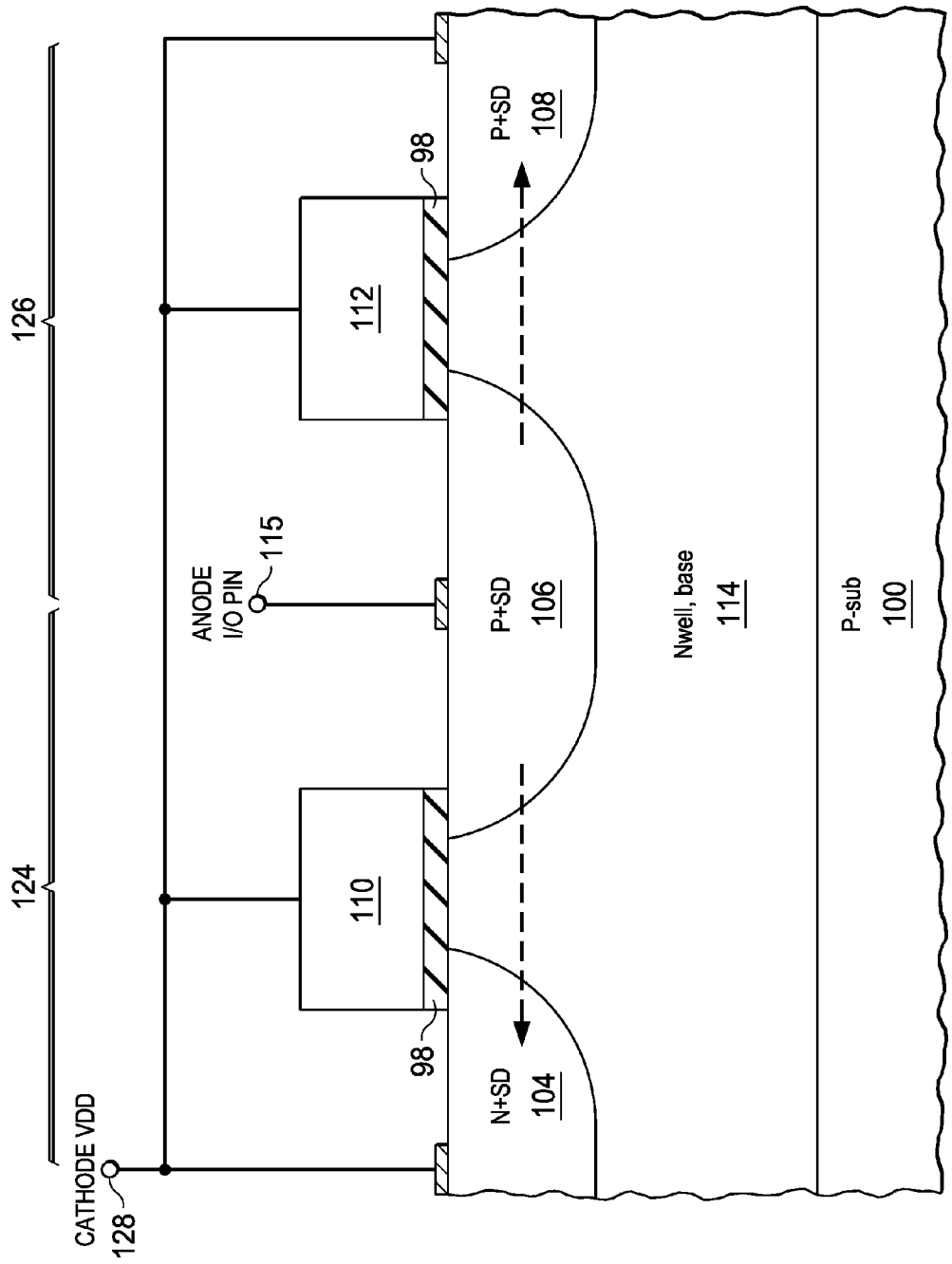
FIGS. 1A and 1B are cross-sections of embodiments of PN/PNP ESD devices.
Figure 1B:
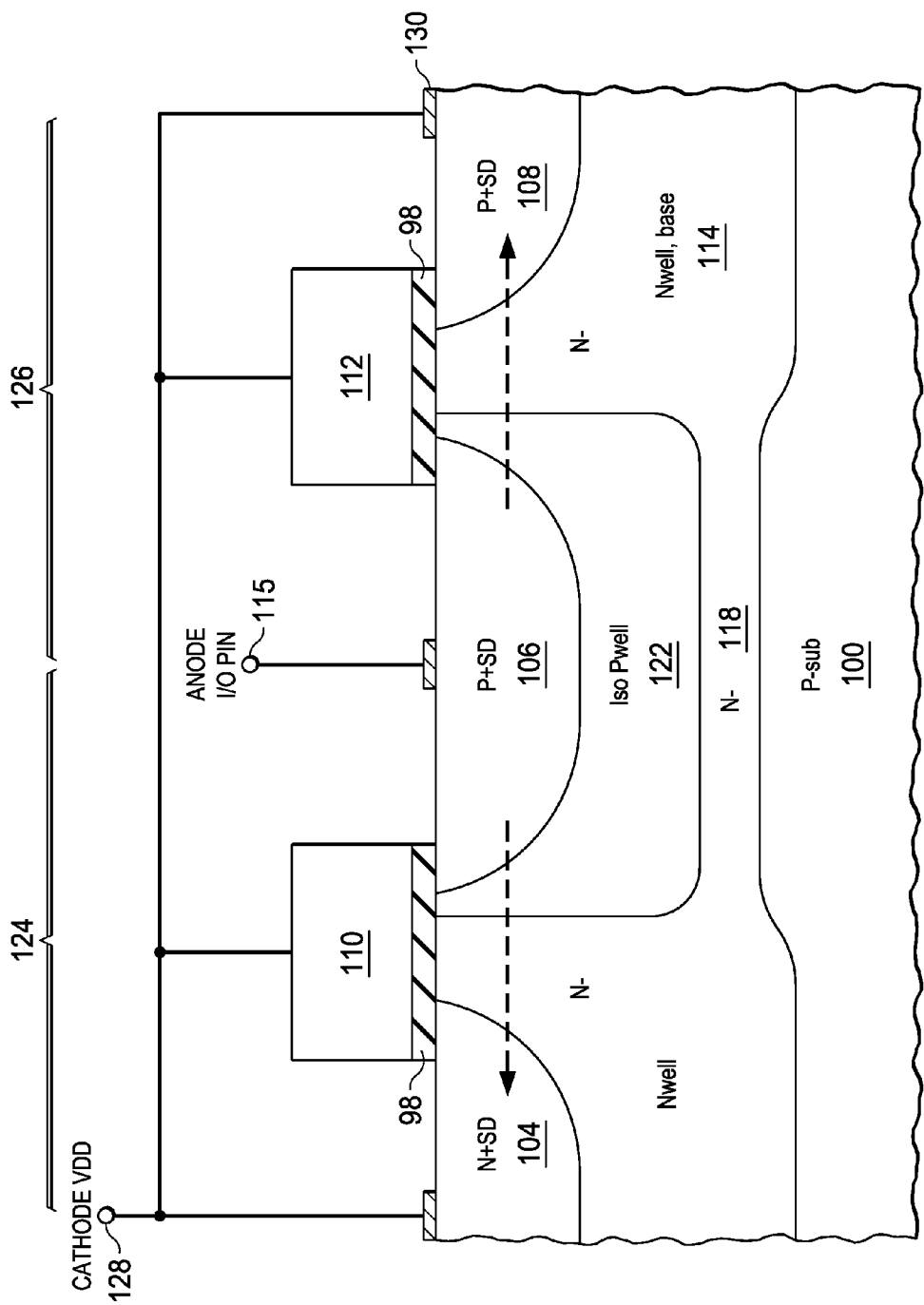

Embodiments of gate spaced PN diode/gate spaced PNP transistor ESD protection devices (GS PN/GS PNP ESD device or PN/PNP ESD device) which short ESD strike current on an I/O pin to Vdd are illustrated in FIGS. 1A and 1B. A gate spaced PNP ESD transistor (GS PNP ESD transistor or PNP ESD transistor) 126 with the collector 108 shorted to the base 114 is formed in parallel with a gate spaced ESD diode (GS ESD diode or ESD diode) 124. The GS ESD diode 124 with fast turn-on avoids voltage overshoot during an ESD strike. The GS PNP ESD transistor 126 turns on during an ESD current strike providing additional ESD current capability and additional ESD protection. In addition, since the collector 108 and base 114 are shorted, when the ESD strike is over, the time required for the P+ 106 to Nwell 114 depletion region to reform is significantly reduced.

The PN/PNP ESD device in FIG. 1A is formed in a p-type substrate 100. Nwell 114 is formed in the p-type substrate 100. Gate dielectric 98 and gate electrodes 110 and 112 are formed at the same time gate electrodes for the IC CMOS transistors are formed. ESD diode gate 110 electrically isolates the P+ ESD diffusion 106 from the nwell contact 104 to form the gate separated ESD diode 124. A PNP ESD transistor 126 is formed under the PMOS transistor gate (ESD bipolar gate or ESD PNP gate) 112. The P+ diffusion 106 of the GS ESD diode 124 forms the emitter of the GS PNP ESD transistor 128. The nwell 114 forms the base and P+ diffusion 108 forms the collector. The collector 108, the ESD bipolar gate 112, the ESD diode gate 110, and the nwell contact 104 are connected to Vdd (cathode). The P+ diffusion 106 of the GS ESD diode 124 (also the emitter of the GS PNP ESD transistor 128) is connected to the I/O pin (anode) 115.

An embodiment of a PN/PNP ESD device with reduced capacitance is shown in FIG. 1B. An isolated pwell 122 is formed under the P+ anode (emitter) 106 diffusion. The isolated pwell 122 may be formed by counter doping the nwell 114 with p-type dopant. The p-type dopant also counter dopes the nwell surrounding the isolated pwell 122 forming a lightly doped (N−) region 118 around the isolated pwell 122. When a reverse voltage is applied across the diode, a depletion region is formed in the isolated pwell 122 and counter doped N− region 118. Diode capacitance is inversely proportional to the width of the diode depletion region. Due to the lower doping levels in the isolated pwell and counter doped N− region, the width of the depletion region in the embodiment FIG. 1B is much larger than the width of the depletion region of the P+ diffusion 106 to nwell 114 diode in FIG. 1A. The capacitance of the PN diode/PNP transistor ESD protection device in FIG. 1B is thus significantly less than the capacitance of the embodiment PN diode/PNP transistor ESD protection device in FIG. 1A. The high frequency performance of the PN/PNP ESD device in FIG. 1B is improved over the high frequency performance of the PN/PNP ESD device in FIG. 1A.

Figure 2A:
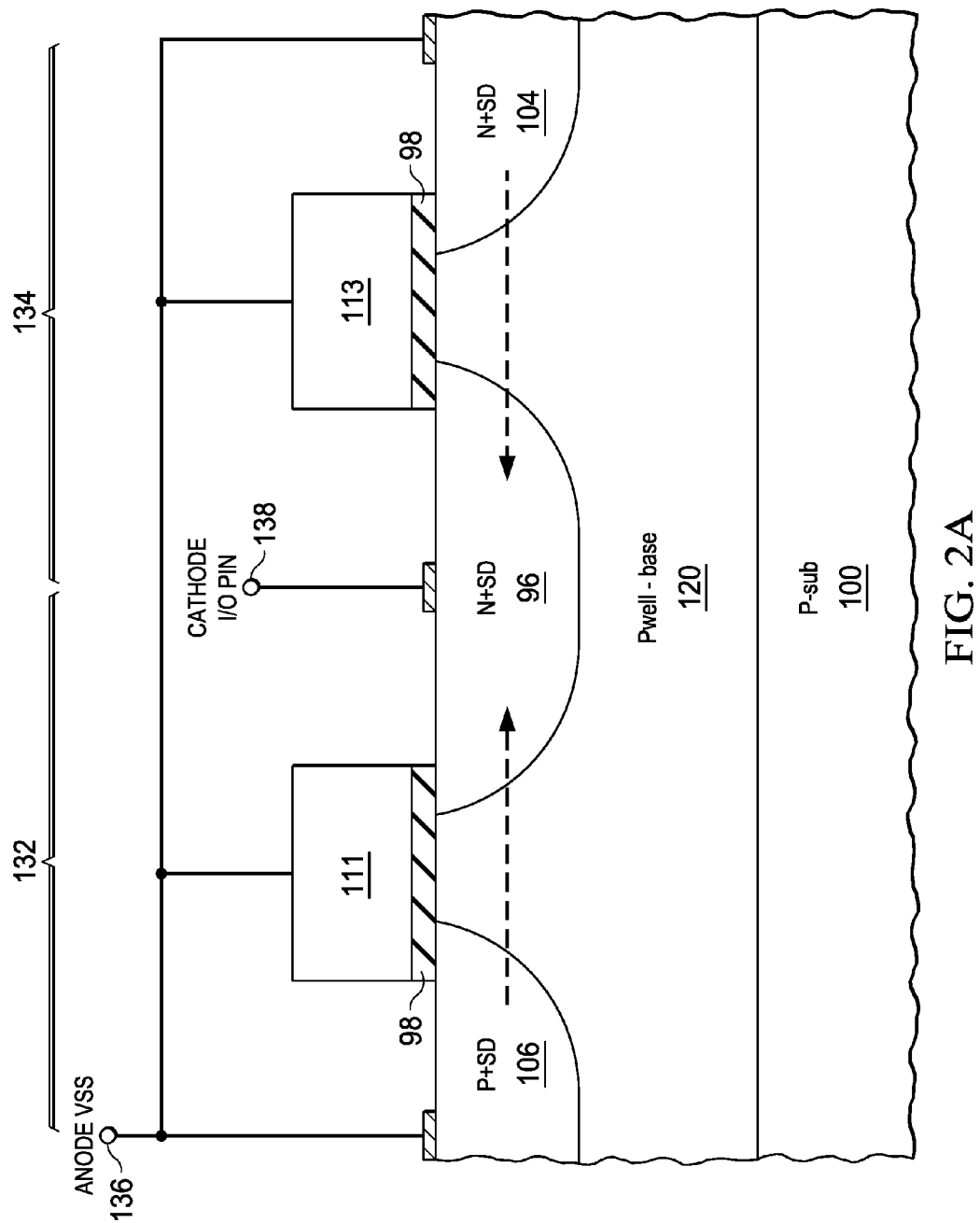
FIGS. 2A and 2B are cross-sections of embodiments of NP/NPN ESD devices.
Figure 2B:
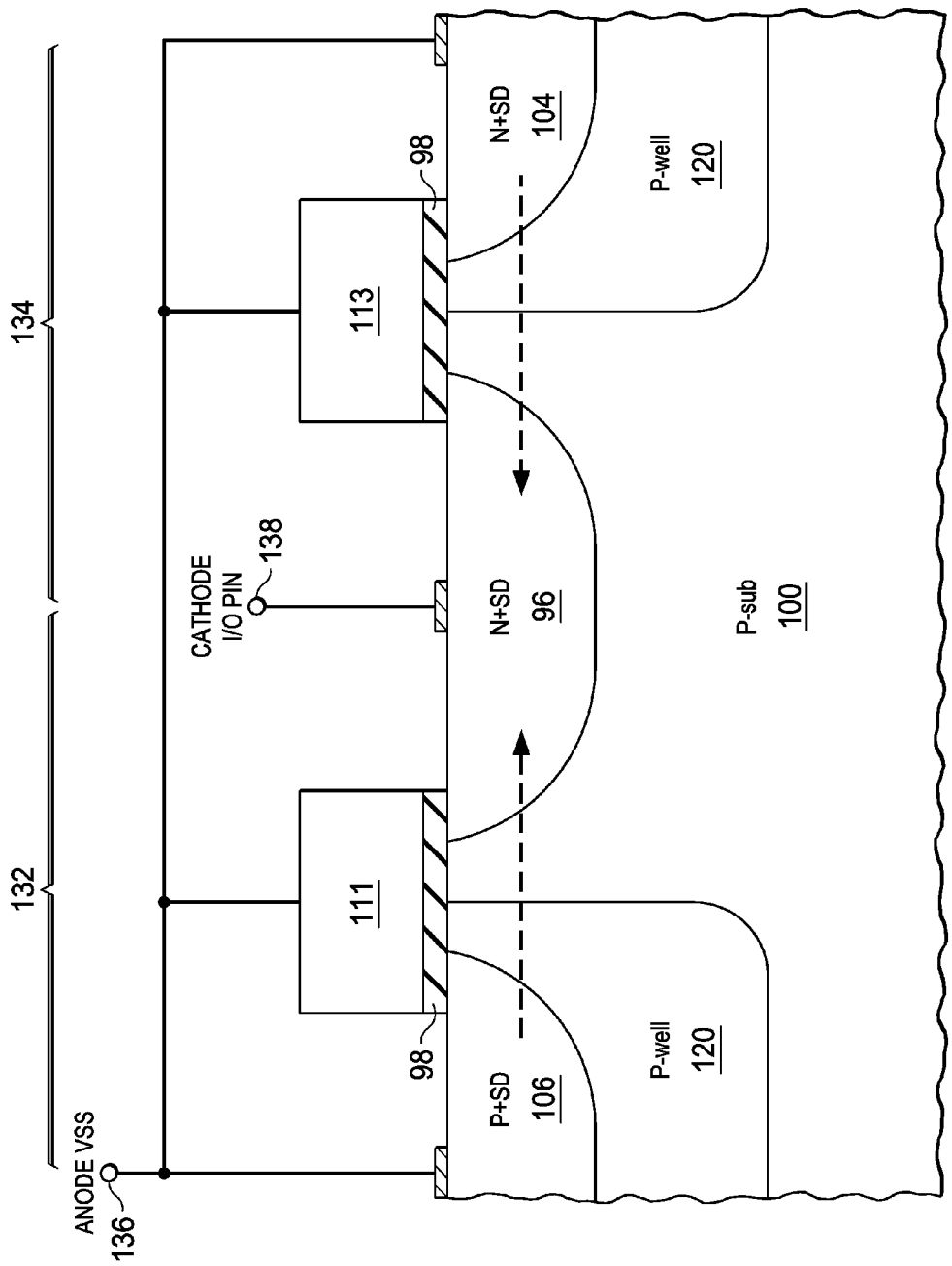

Embodiments of gate spaced NP/gate spaced NPN ESD devices (GS NP/GS NPN ESD device or NP/NPN ESD device) which short ESD strike current on an I/O pin to Vss (ground) are illustrated in FIGS. 2A and 2B. A gate spaced NPN ESD transistor (NPN ESD transistor) 134 with the collector 104 shorted to the base 120 is formed in parallel with a gate spaced NP ESD diode (NP ESD diode) 132. The NP ESD diode 132 with fast turn-on avoids voltage overshoot during an ESD strike. The NPN ESD transistor 126 turns on during an ESD current strike providing additional ESD current capability and additional ESD protection. Since the collector 104 and base 120 of the NPN ESD transistor are shorted, the transistor also aids in reverse charge recovery when the ESD strike is over. Consequently, the time required to reform the depletion region between the N+ diffusion 96 to pwell 120 diode is significantly reduced, improving the frequency response of the diode.

The NP/NPN ESD device in FIG. 2A is formed in a p-type substrate 100. Pwell 120 is formed in the p-type substrate 100. Gate dielectric 98 and gate electrodes 111 and 113 are formed at the same time that gate electrodes for the IC CMOS transistors are formed. ESD diode gate 111 electrically isolates the N+ diffusion 96 of the NP ESD diode from the pwell contact 106 to form the gate separated NP ESD diode 132. A gate spaced NPN ESD transistor 134 is formed under the NMOS transistor gate (ESD bipolar gate or ESD NPN gate) 113. The N+ diffusion 96 of the gate separated NP ESD diode 132 forms the emitter of the gate spaced NPN ESD transistor 134. The pwell 120 forms the base and N+ diffusion 104 forms the collector. The collector 104, the ESD NPN gate 113, the ESD diode gate 111, and the pwell contact 106 are connected to Vss 136 (anode). The N+ diffusion 96 of the gate separated NP ESD diode 132 which is also the emitter of the NPN ESD transistor 134 is connected to the I/O pin (cathode) 138.

An embodiment of an NP/NPN ESD device with reduced capacitance is shown in FIG. 2B. Pwell 120 is removed from under the cathode (emitter) 96 diffusion. The NP ESD diode is now formed between the heavily doped N+ diffusion 96 and the lightly doped p-type substrate. The width of the depletion region is inversely proportional to doping concentration of the diode diffusions. The width of the depletion region of N+ diffusion 96 to the lightly doped p-type substrate diode in FIG. 1B is significantly larger than the width of the depletion region of the N+ diffusion 96 to pwell 120 diode in FIG. 2A. The capacitance of the NP/NPN ESD device in FIG. 2B is thus much lower than the NP diode/NPN transistor ESD device in FIG. 2A. The high frequency performance of the NP diode/NPN transistor ESD protection device in FIG. 2B is significantly improved when compared with the high frequency performance of the NP/NPN ESD device in FIG. 2A.

The major steps in a process flow for building an embodiment of a PN/PNP ESD device in an integrated circuit are illustrated in FIGS. 3A through 3H. A top down view of the patterns used to form the integrated circuit is shown in the top part of each FIG. and a cross sectional view taken through cut line 101 is shown in the bottom part of each FIG.

Figure 3A:
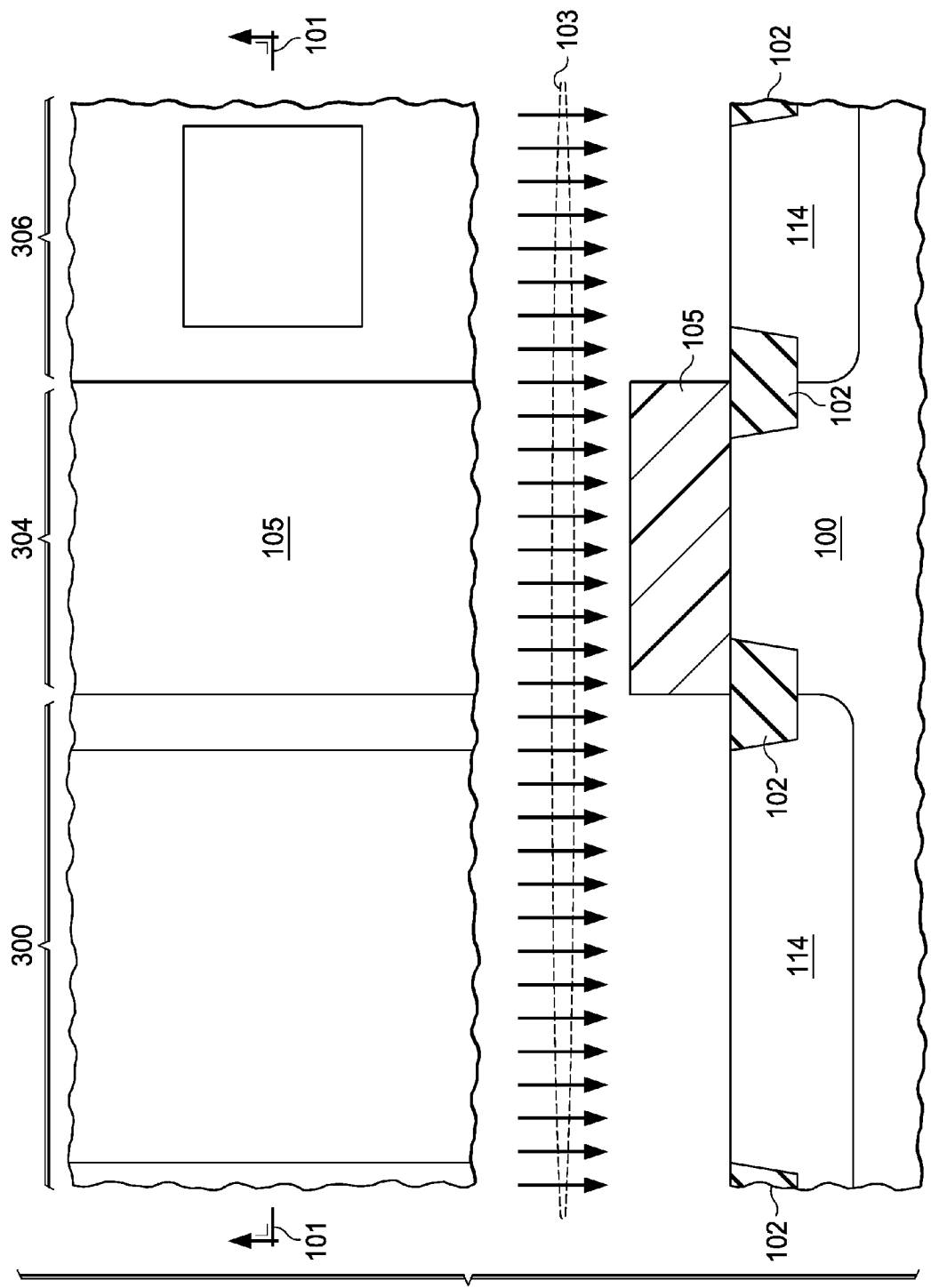
FIGS. 3A-3I are illustrations of the patterns and steps in the fabrication of integrated circuits formed according to principles of the invention.

A partially processed integrated circuit wafer is shown in FIG. 3A. Shallow trench isolation geometries 102 are formed on a p-type substrate 100. An nwell photo resist pattern 105 is formed on the integrated circuit and n-type dopant 103 such as phosphorus or arsenic is implanted to form nwells 114. An embodiment of a PN diode/PNP transistor ESD device is formed in sections 300. An NMOS transistor is formed in region 304 and a PMOS transistor is formed in region 306.

Figure 3B:
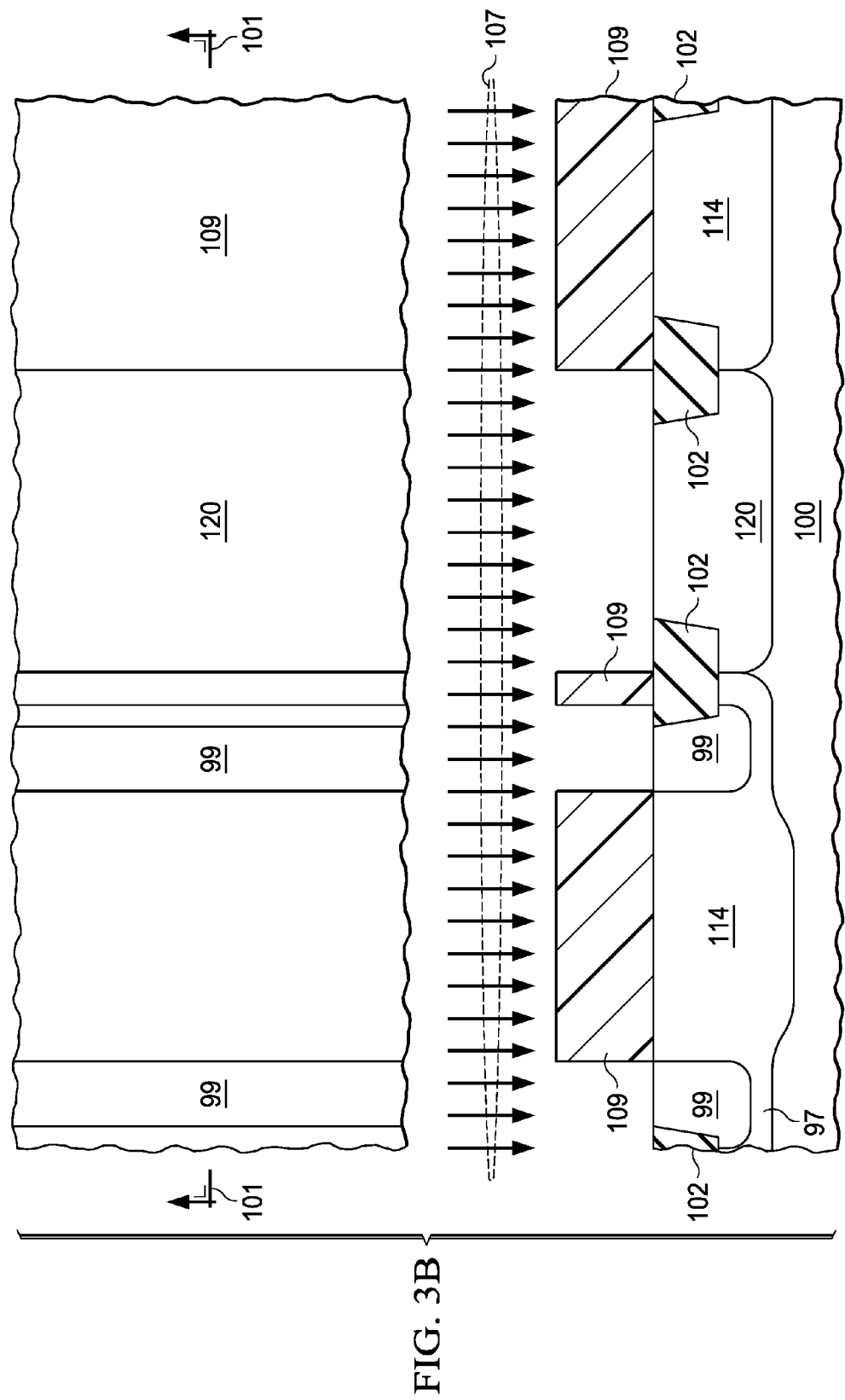

Referring now to FIG. 3B a pwell photo resist pattern 109 is formed on the integrated circuit and a p-type dopant 107 such as boron or BF2 is implanted to form pwell 120 (for the NMOS transistor 304) and to form isolated pwells 99 within the nwell 114 (for the anode/emitter diffusion of the NP/NPN ESD protection device). The isolated pwells 99 are optional. The optional isolated pwells are the preferred embodiment because they significantly reduce capacitance of the NP/NPN ESD protection device.

Figure 3C:
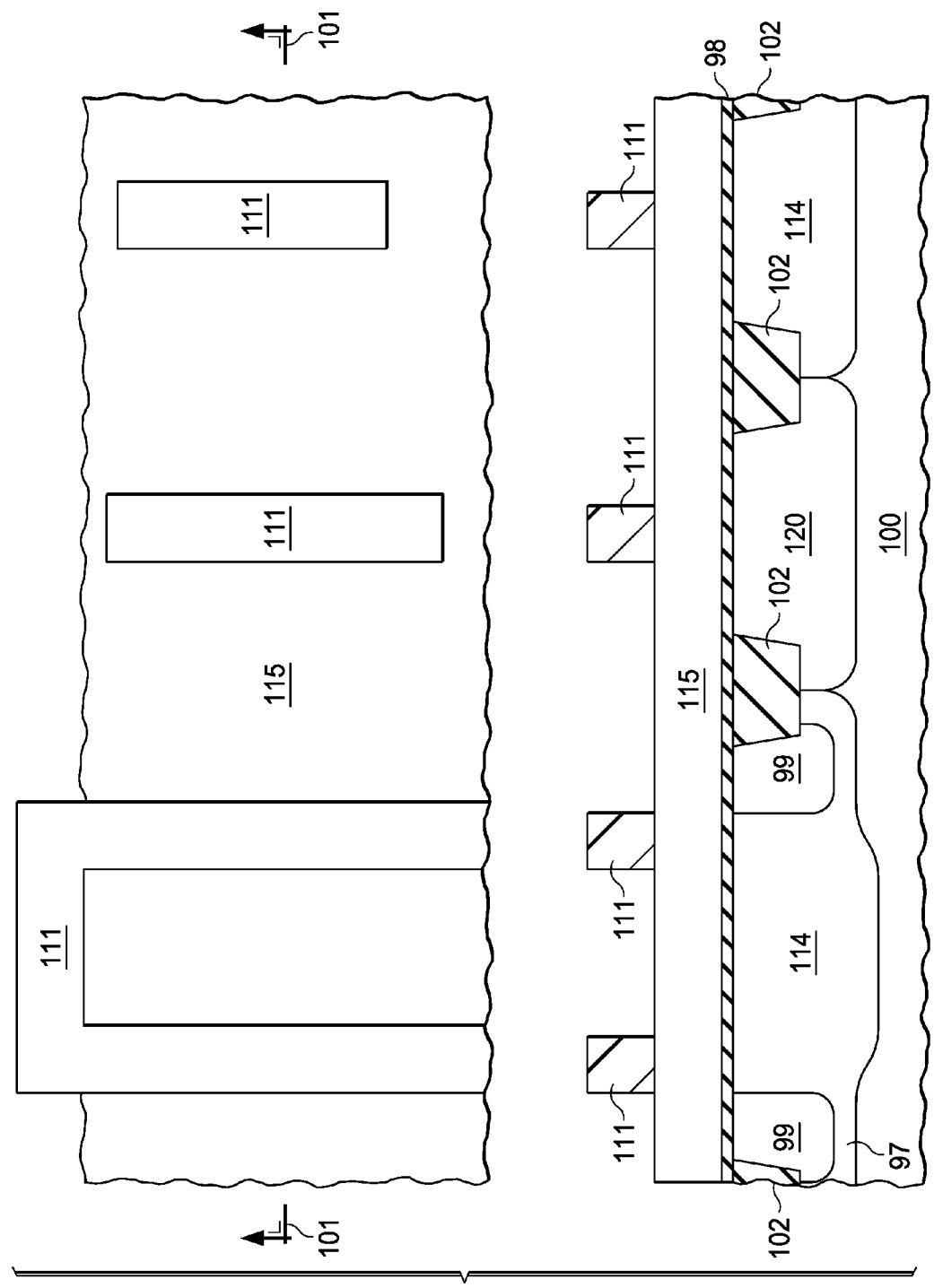

Gate material 115 is deposited on a gate dielectric 91 as shown in FIG. 3C. The gate dielectric 91 may be a dielectric such as silicon dioxide, silicon oxynitride, silicon nitride, or a high-k dielectric such as hafnium oxide or hafnium silicon oxide. The gate material may be polysilicon, silicide, or metal. A gate photo resist pattern 111 is formed on the gate material 115.

Figure 3D:
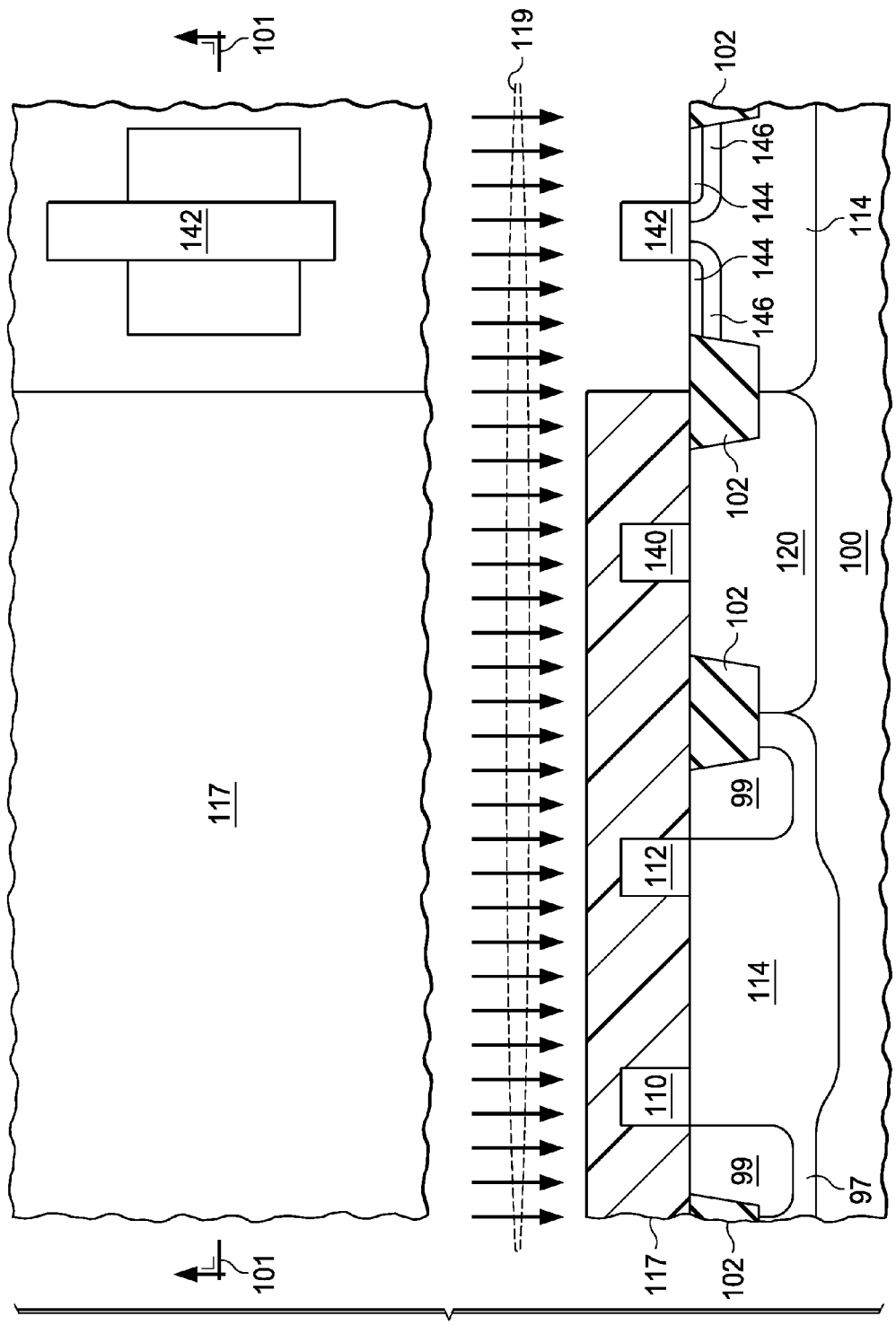

In FIG. 3D the integrated circuit is shown after the gate material 115 is etched to from the ESD diode gate 110, the ESD PNP gate 112, the NMOS transistor gate 140 and the PMOS transistor gate 142. A PMOS transistor extension photo resist pattern 117 is formed on the integrated circuit and a p-type dopant 119 is implanted to form source and drain extensions 144 self aligned to the PMOS transistor gate 142. An N-type dopant may also be implanted at an angle to form halo diffusions 146 under the edges of the PMOS transistor gate 142. As shown in FIG. 3D, the extension implants are blocked from the PN diode/PNP transistor ESD device in region 300.

Figure 3E:
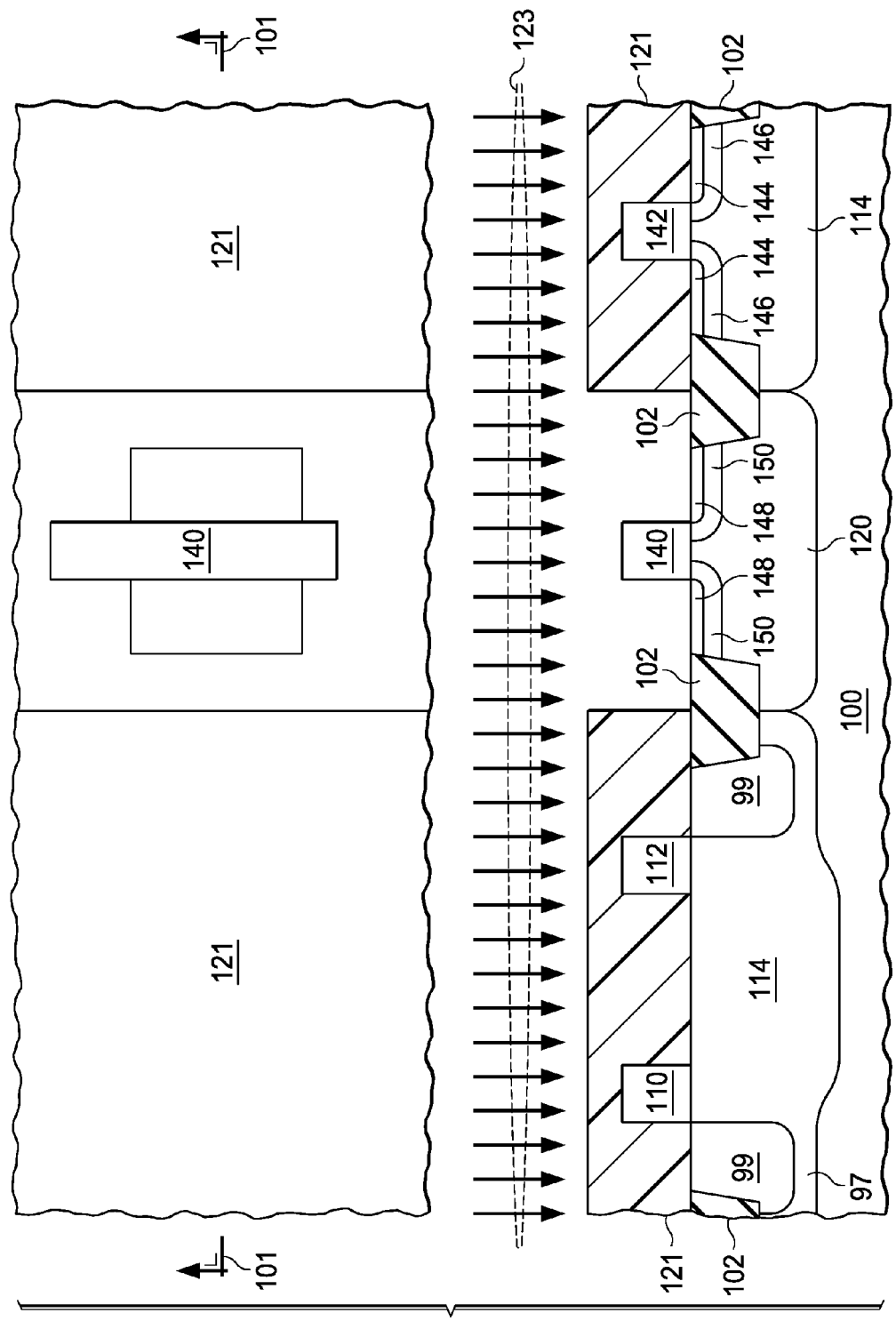

An NMOS transistor extension photo resist pattern 121 is formed on the integrated circuit and an n-type dopant 123 is implanted to form source and drain extensions 148 on the NMOS transistor gate 140. A p-type dopant may also be implanted at an angle to form halo diffusions 150 under the edges of the NMOS transistor gate 140. As shown in FIG. 3E, the extension implants are blocked from the PN diode/PNP transistor ESD device region 300.

Figure 3F:
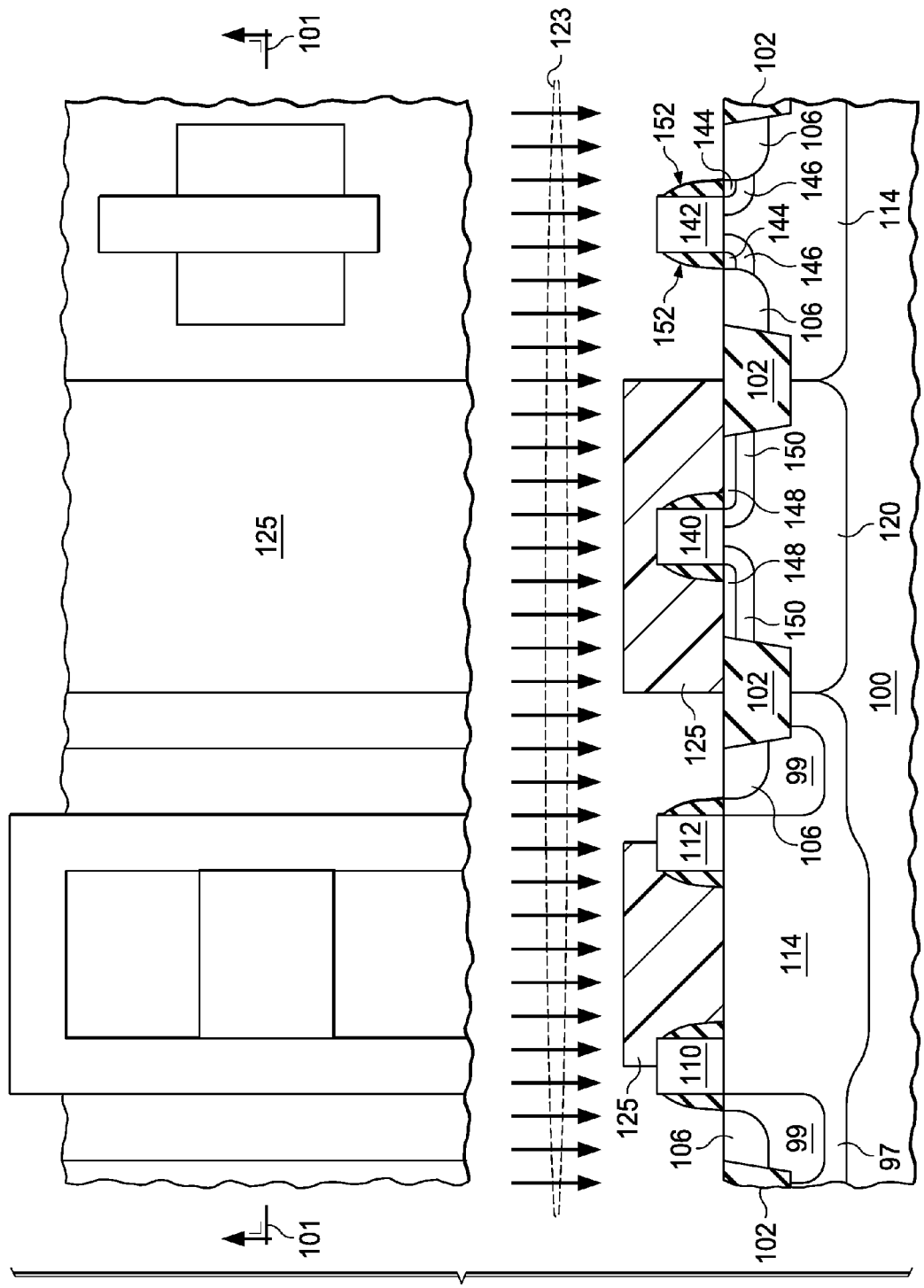

Referring now to FIG. 3F, sidewalls 152 are formed on the vertical surfaces of the gates 110, 112, 140, and 142, and a PMOS source and drain photo resist pattern 125 is formed on the integrated circuit. P-type dopant 123 such as boron and BF2 is implanted to form deep source and drain P+ diffusions 106 self aligned to the PMOS transistor gate 142 and self aligned to the PN ESD diode gate 110 and to the ESD PNP gate 112 to form emitter and collector diffusions for the PNP ESD transistor.

Figure 3G:
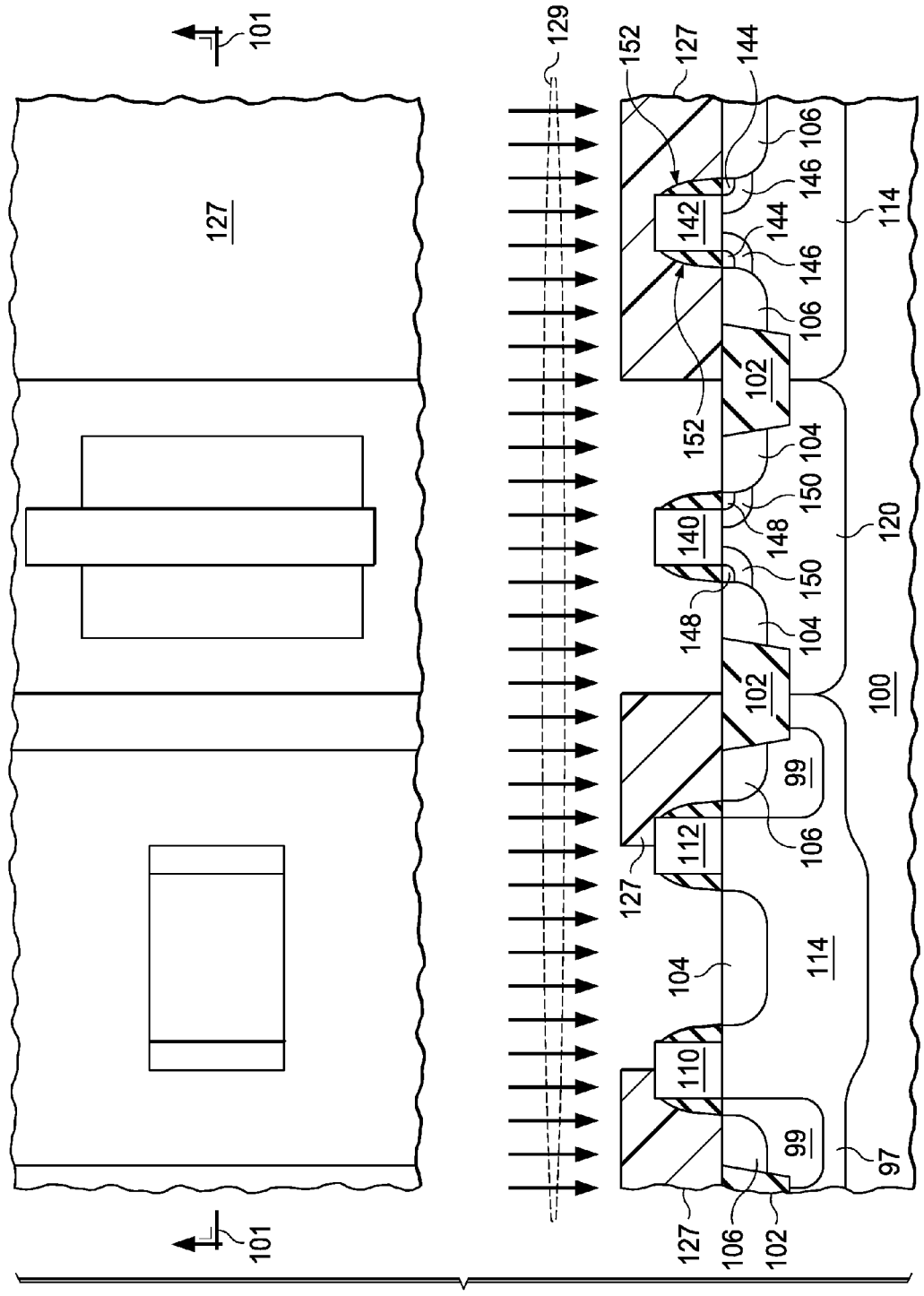

In FIG. 3G, NMOS source and drain photo resist pattern 127 is formed on the integrated circuit and an n-type dopant 129 such as phosphorus and arsenic is implanted to form deep source and drain diffusions on the NMOS transistor 140 and to form the base/cathode diffusion 104 in the PN/PNP ESD device.

Figure 3H:
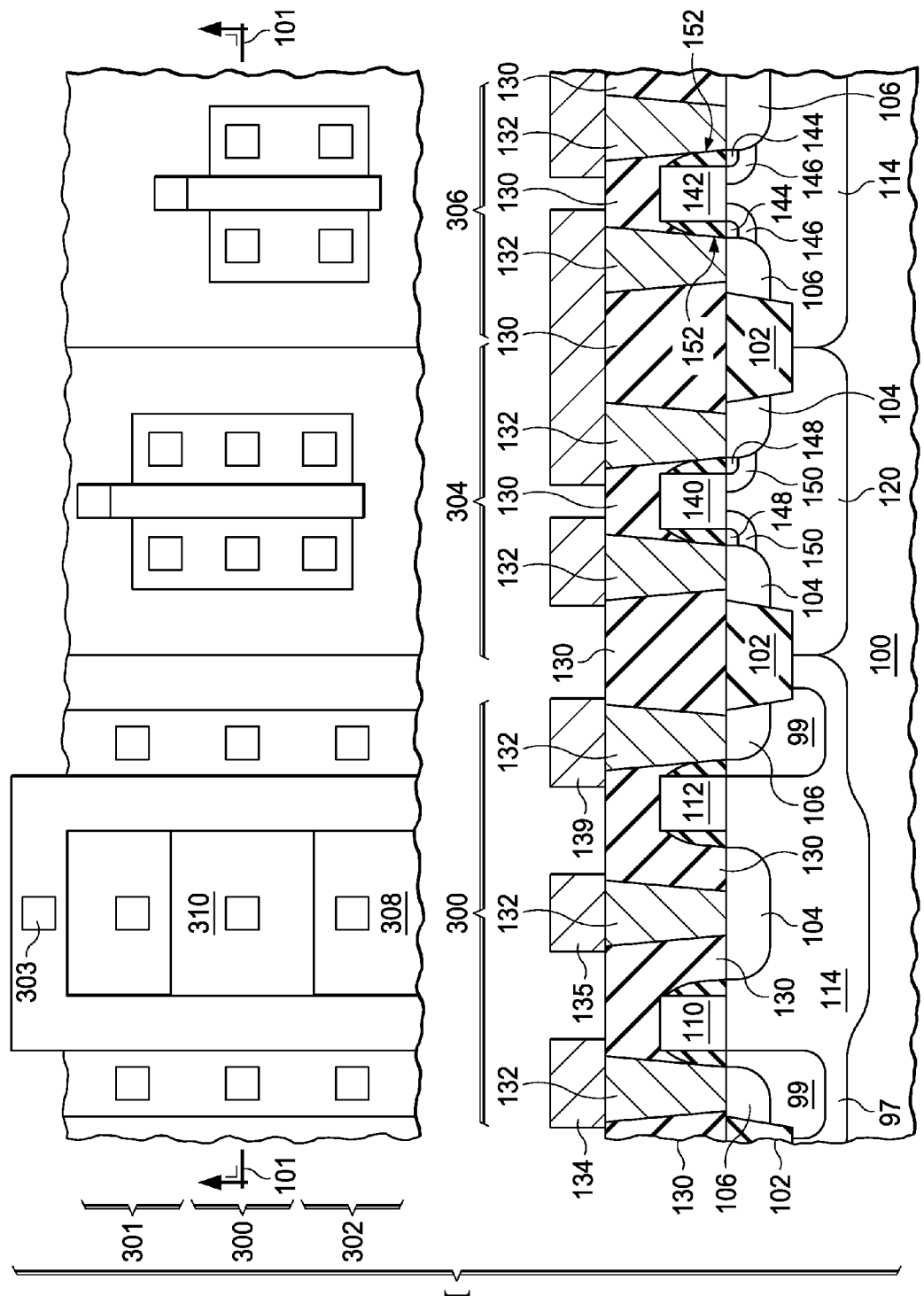

As shown in the top down view in FIG. 3H, the P+ collector diffusions 308 of the GS PNP ESD transistors 301 and 302, and the N+ base 310 share a common active area and may be shorted using silicide. First level of interconnect geometries 134 and 139 may be a strips of metal-1 which shorts the collectors of the GS PNP ESD transistors 301 and 301 with the cathodes of the GS PN ESD diodes 300. These metal strips, 134 and 139, may then be connected to Vdd through additional levels of metal. First level of interconnect geometry 135 may be a strip of metal-1 which shorts the emitters of the GS PNP ESD transistors 301 and 302 with the anode 310 of the GS PN ESD diode 300 and to the gates 303 of the GS PNP ESD transistors 301 and 302 and the GS PN diode 300.

The cross section at the bottom of FIG. 3H is along cut line 101 through the back-to-back PN ESD diodes 300 of the PN/PNP ESD device.

Figure 3I:
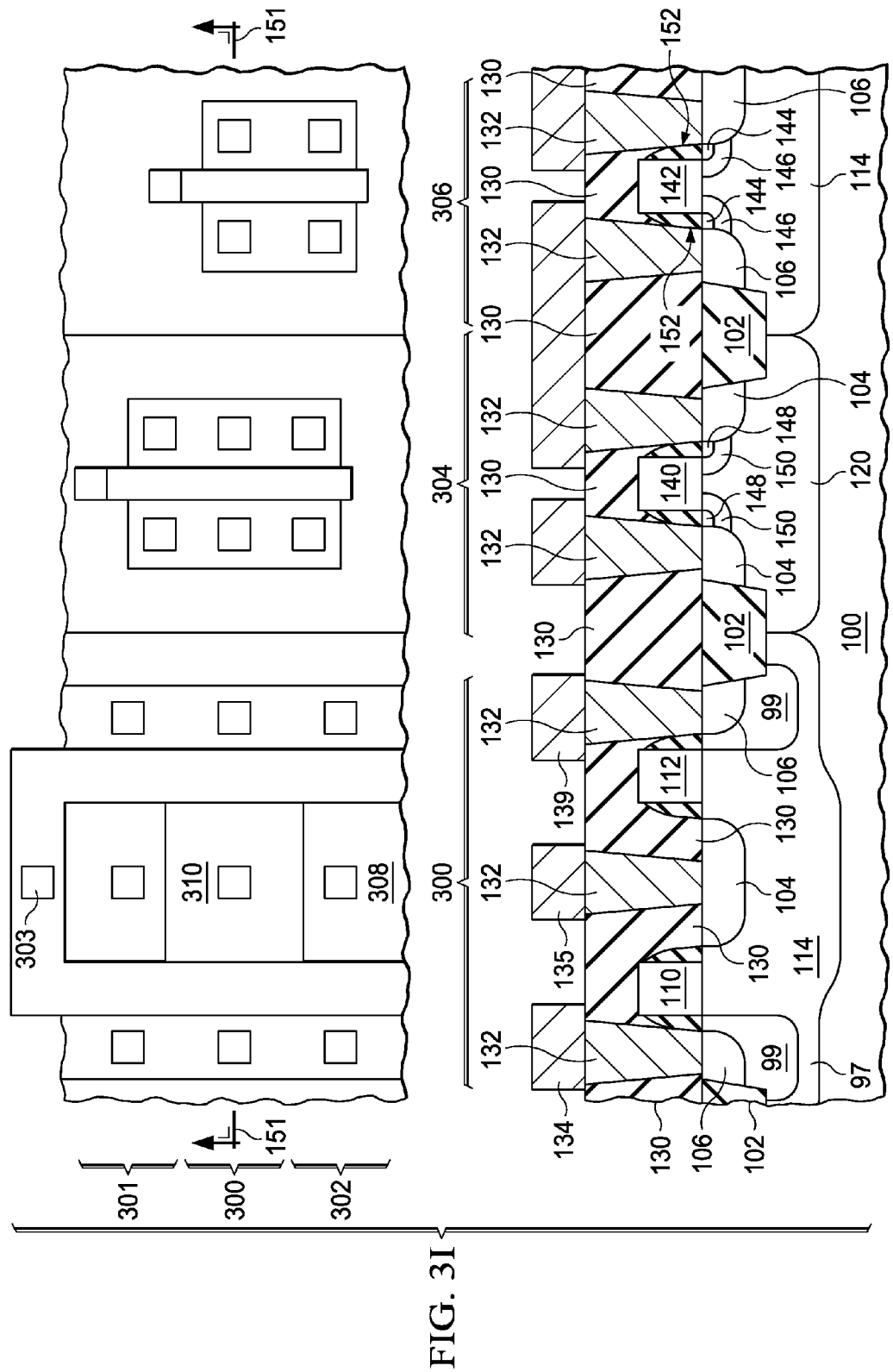

The cross section at the bottom of FIG. 3I is along cut line 151 through the back-to-back PNP ESD transistors 302 of the PN/PNP ESD device. The back-to-back PNP ESD transistors 302 are wired in parallel with the back-to-back PN ESD device.

Referring again to FIGS. 3H and 3I pre-metal dielectric (PMD) 130 which may include an etch stop liner or a stress liner is deposited on the integrated circuit. Contact plugs 132 are formed through the PMD to form electrical connection between the transistor source and drain diffusions on the NMOS 140 and PMOS 142 transistors and the interconnect 134. The contact plugs may be CVD-tungsten. The interconnect 134 may be a metal such as tungsten, aluminum alloy, or copper. The contact plugs 132 also connect the PN ESD diode 300 diffusion and the emitter and collector diffusions of the PNP ESD transistor 302 to the interconnect 134.

Additional layers of interconnect and dielectric may be formed on the integrated circuit to complete the IC processing.

The circuit diagram of a preferred embodiment layout of a PN/PNP ESD device is shown in FIG. 4 superimposed on the layout. It is an expanded version of the top down view of the PN/PNP ESD device layout in FIG. 3H. The device consists of two gate separated PN ESD diodes 414 and 416 and four PNP ESD transistors, 406, 408, 410, and 412. PNP ESD transistors 406 and 410 are connected in parallel with PN ESD diode 414 and PNP ESD transistors 408 and 412 are connected in parallel with PN ESD diode 416. The layout has two ESD PN diodes and four PNP ESD transistors, but the preferred layout may have one or more ESD PN diodes and one or more PNP ESD transistors. The ESD PN diodes and the PNP ESD transistors are wired in parallel between and input/output pin and Vdd.

The first gate separated ESD diode 414 is formed between P+ diffusion 402 and the nwell 114 which is under the N+ well contact 420. The gate 400 electrically isolates the P+ diffusion 402 from the N+ well contact 420. The second gate separated ESD diode 416 is formed between P+ diffusion 404 and the nwell 114 which is under the N+ well contact 420. The gate 400 electrically isolates the P+ diffusion 404 from the N+ well contact 420.

P+ diffusion 402 forms the emitter of the first PNP ESD transistor 406, the nwell 114 under the N+ well contact 420 forms the base, and the P+ diffusion 418 forms the collector. P+ diffusion 404 forms the emitter of the second PNP ESD transistor 408, the nwell 114 under the N+ well contact 420 forms the base, and the P+ diffusion 418 forms the collector. P+ diffusion 402 forms the emitter of the third PNP ESD transistor 410, the nwell 114 under the N+ well contact 420 forms the base, and the P+ diffusion 422 forms the collector. P+ diffusion 404 forms the emitter of the fourth PNP ESD transistor 412, the nwell 114 under the N+ well contact 420 forms the base, and the P+ diffusion 422 forms the collector.

A vertical stripe of metal-1 may be formed over the center contacts to short the gate 400 and the collectors, 418 and 422 of the PNP ESD transistors (406, 408, 410, and 412) to the cathode 420 of the PN ESD diodes (414 and 416) and to connect them to Vdd. Vertical stripes of metal-1 may also be formed over diffusions 402 and 404 to short the emitters of the PNP ESD transistors to the anodes of the PN ESD diodes and to connect them to an input/output pin.

The layout provides short ESD current paths for fast turn on and recovery. The gate separated PN ESD diodes, 414 and 416, provide fast turn on time and the four PNP ESD transistors, 406, 408, 410, and 412 provide additional ESD current handling capability and fast recovery time.

The performance of the PN/PNP ESD protection device may be enhanced by increasing the mobility of the carriers. For example hole mobility in the PNP transistor may be increased by applying compressive stress to the base of the PNP ESD transistor. Compressive stress may be applied by forming P+ diffusions 402, 404, 418, and 422 in SiGe and by depositing compressive etch stop liner over the PNP ESD transistors 406, 408, 410, and 412.

Figure 5A:
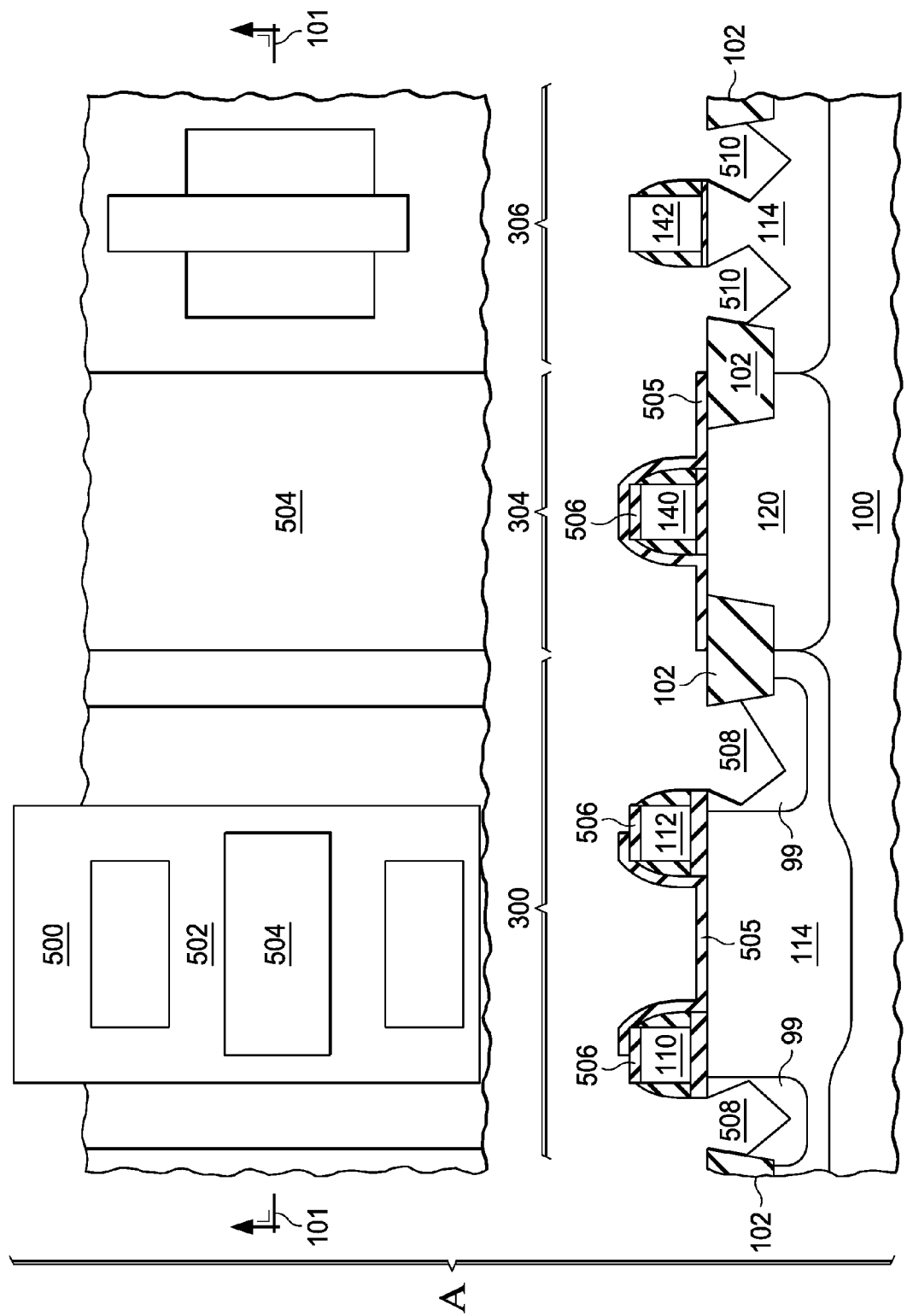
FIGS. 5A-5C are illustrations of steps in the fabrication of integrated circuits formed according to principles of the invention.
Figure 5B:
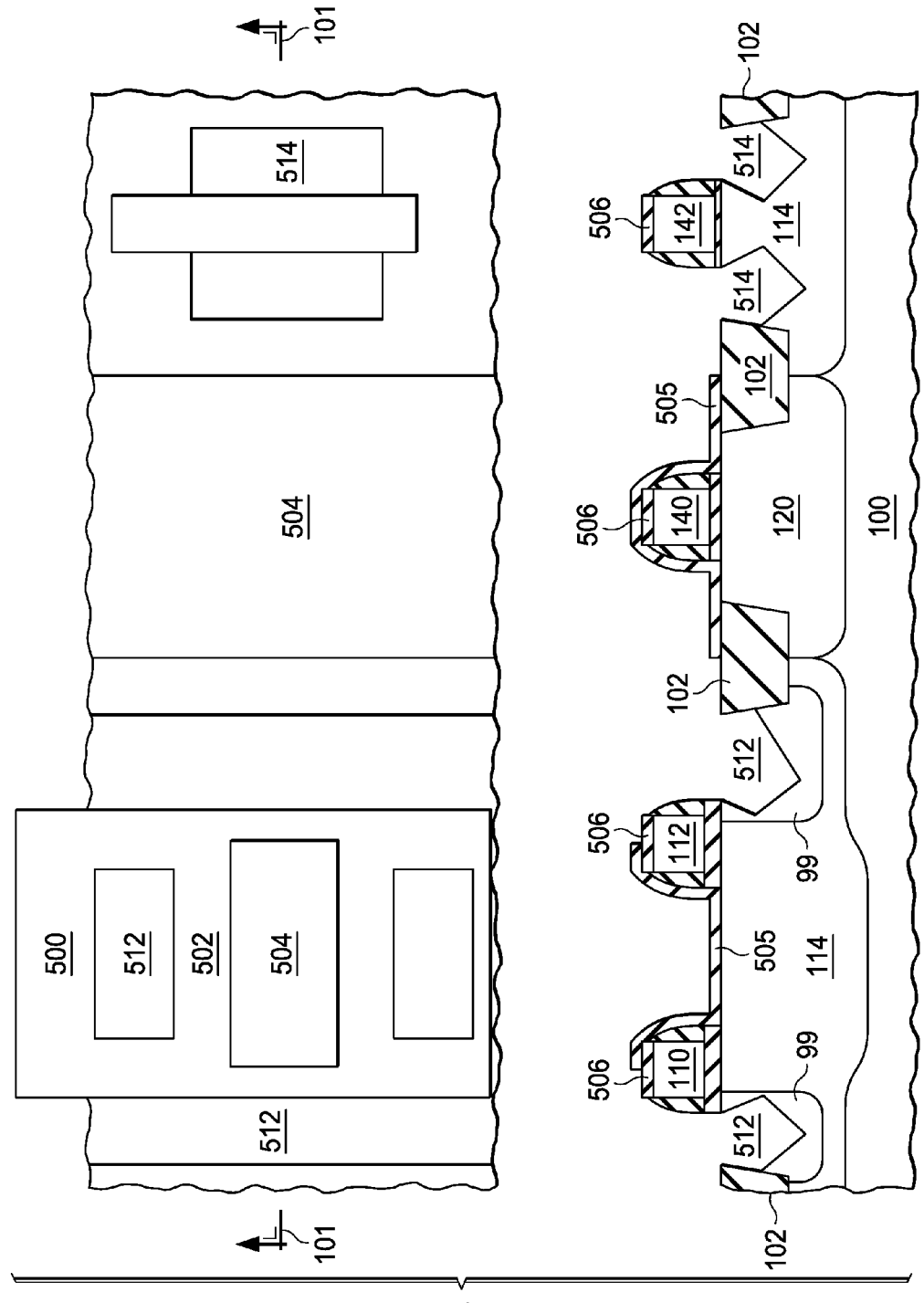
Figure 5C:
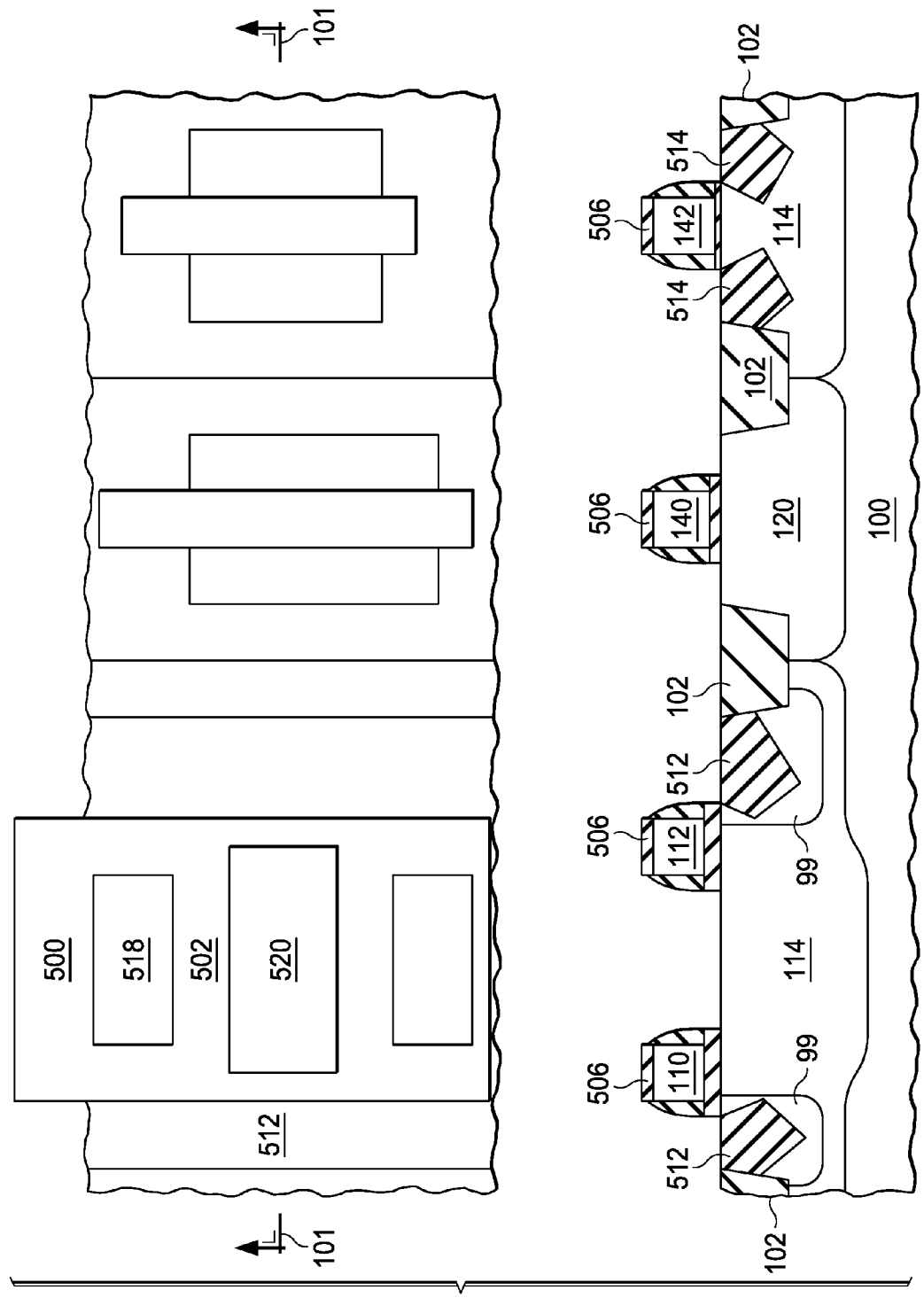

The steps in the process flow for forming P+ diffusions which contain embedded SiGe is shown in FIGS. 5A-5C. These steps may be inserted after sidewall 152 formation and prior to P+ source and drain pattern 125 in FIG. 3F.

As shown in FIG. 5A a dielectric capping layer 506 is formed on the gate 500. This completely encapsulates the gates with dielectric to prevent epitaxial SiGe growth on the gates. A dielectric SiGe blocking layer 504 is deposited on the wafer and then patterned and etched to form openings where epitaxial SiGe growth is desired. As shown in FIG. 5A the NMOS transistor 304 area and the nwell 144 contact area 505 is blocked with the SiGe blocking layer 504. Trenches 508 and 510 are etched in the exposed silicon regions.

As shown in FIG. 5B, epitaxial SiGe is then grown to refill the trenches 512 and 514.

As shown in FIG. 5C, optional gate material tabs 516 are formed using gate material to separate the regions where SiGe epi is grown 518 from the regions where SiGe is not grown 520. This is a preferred embodiment because it reduces crystal defects that may form at the SiGe/single crystal silicon interface.

Referring again to FIG. 5C, the SiGe blocking layer 504 is removed. The next process step is to form a source and drain photo resist pattern 125 as shown in FIG. 3F. The SiGe in the emitter and collector diffusions of the PNP ESD transistors enhances hole mobility in the nwell base thus reducing the recovery time of the PNP ESD transistor.

Additional enhancement to the PN/PNP ESD protection device may be achieved by blocking SiGe from the P+ diffusion of the gate separated PN ESD diodes. SiGe reduces the mobility of electrons in the PN ESD diode. Blocking SiGe from the P+ diffusion of the gate separated PN ESD diode improves PN ESD diode performance at high frequency. Process steps and patterns for blocking SiGe formation in the P+ diffusion of the gate separated PN ESD diode are shown in FIGS. 6A-6B.

Figure 6A:
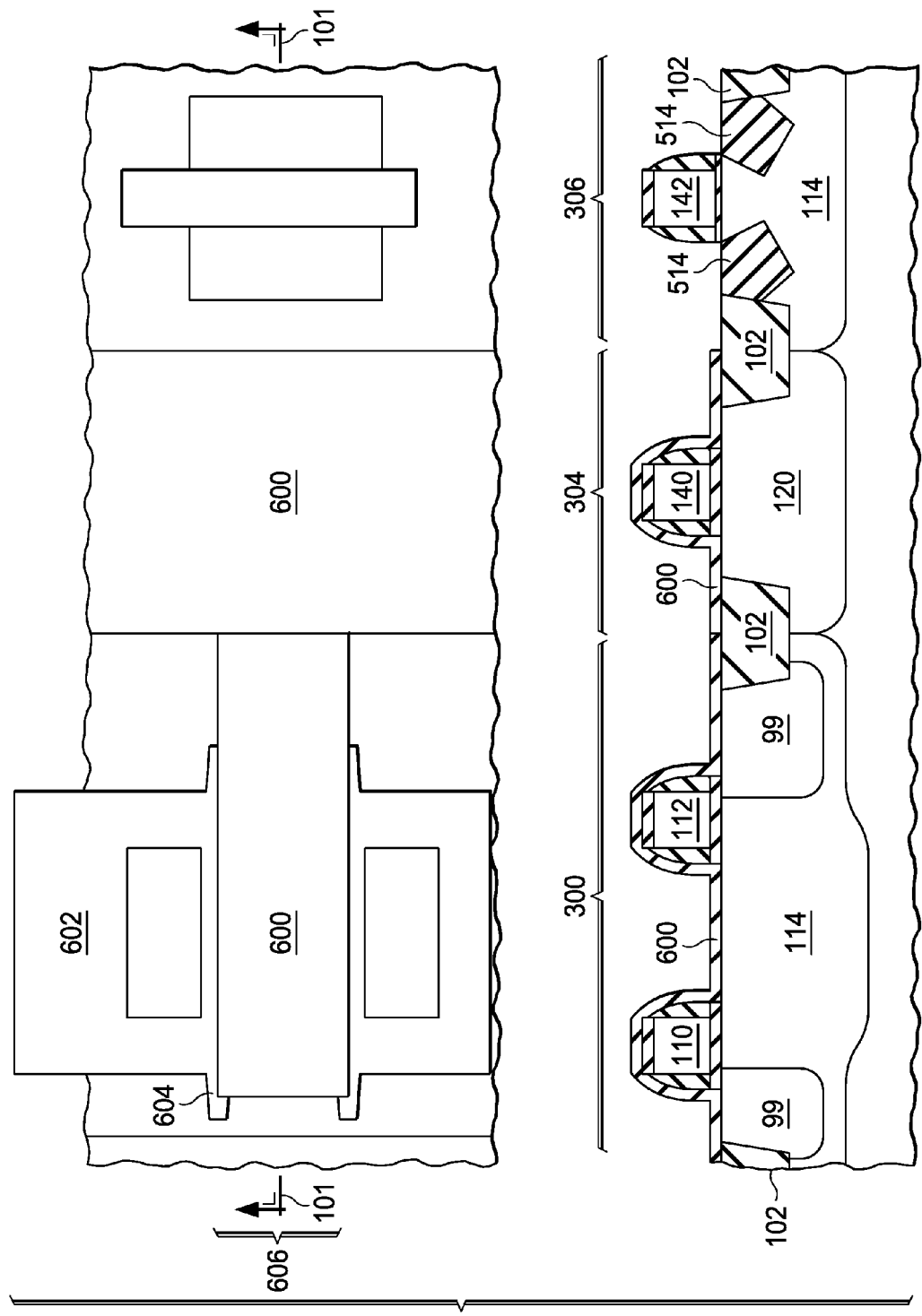
FIGS. 6A-6B are illustrations of steps in the fabrication of integrated circuits formed according to principles of the invention.

As shown in FIG. 6A SiGe blocking layer 600 covers the NMOS transistor area 304 and also covers the PN ESD diode area 606.

Figure 6B:
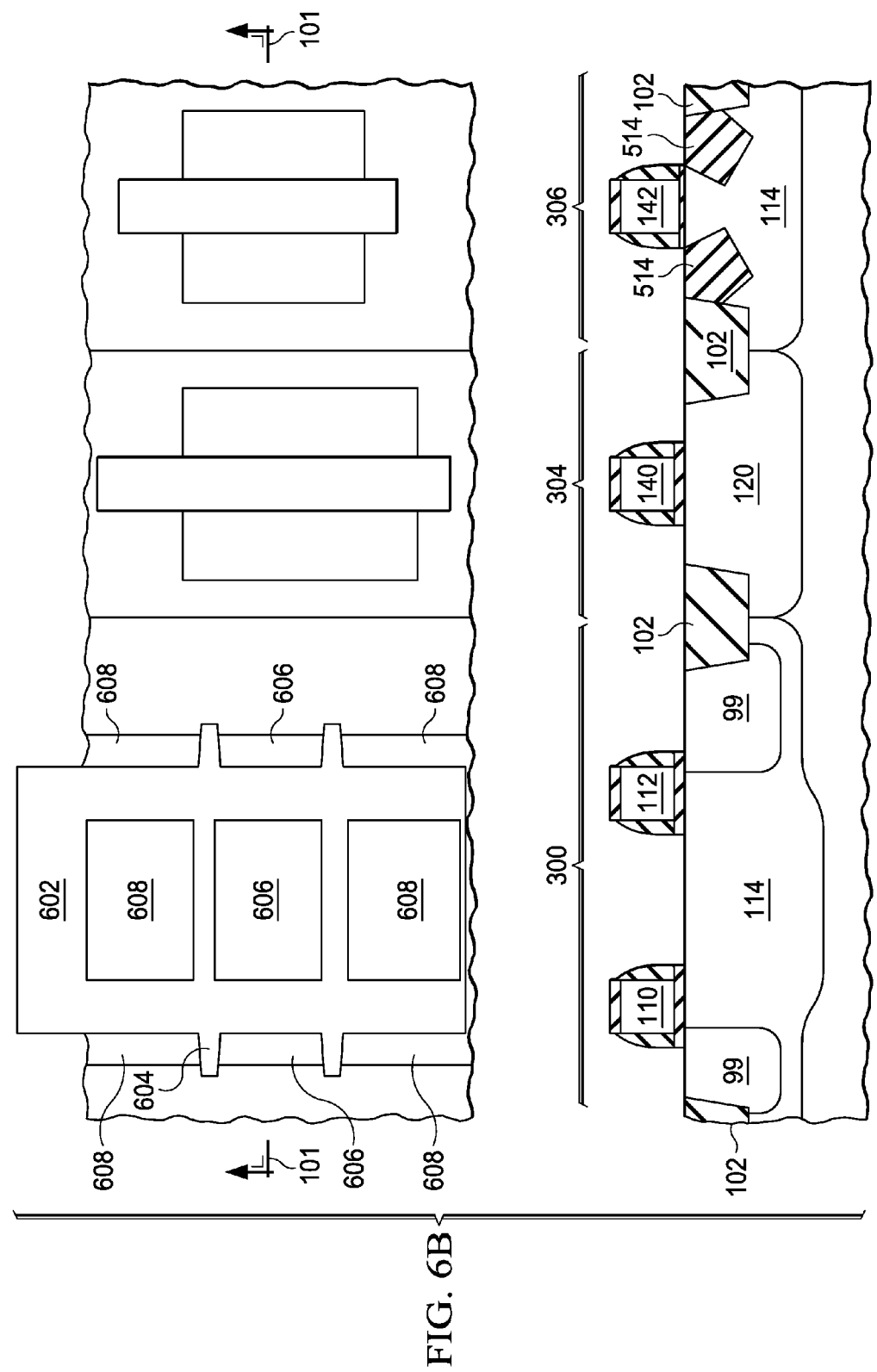

Optional tabs of gate material 604 may be formed on the gate 602 as shown in FIG. 6B to separate the areas where SiGe is grown 608 from the single crystal silicon areas 606 where SiGe is not grown. The tabs of gate material 604 are preferred because they reduce crystal defect formation at the single crystal, SiGe interface.

The above embodiments are illustrated for a PN/PNP ESD device.

Figure 7A:
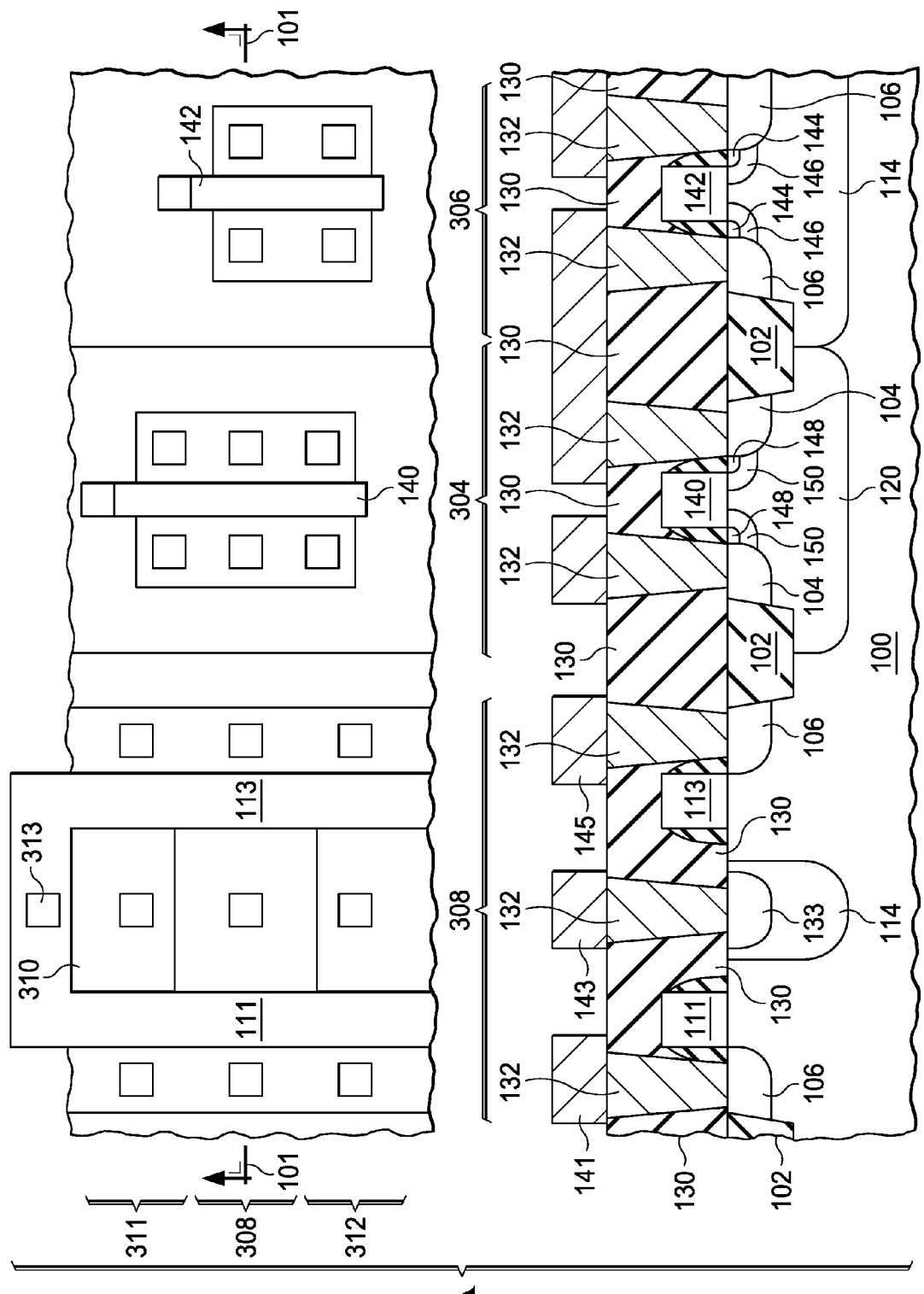
FIG. 7A-7B are top down views and cross-sections of an embodiment of an NP/NPN ESD device.
Figure 7B:
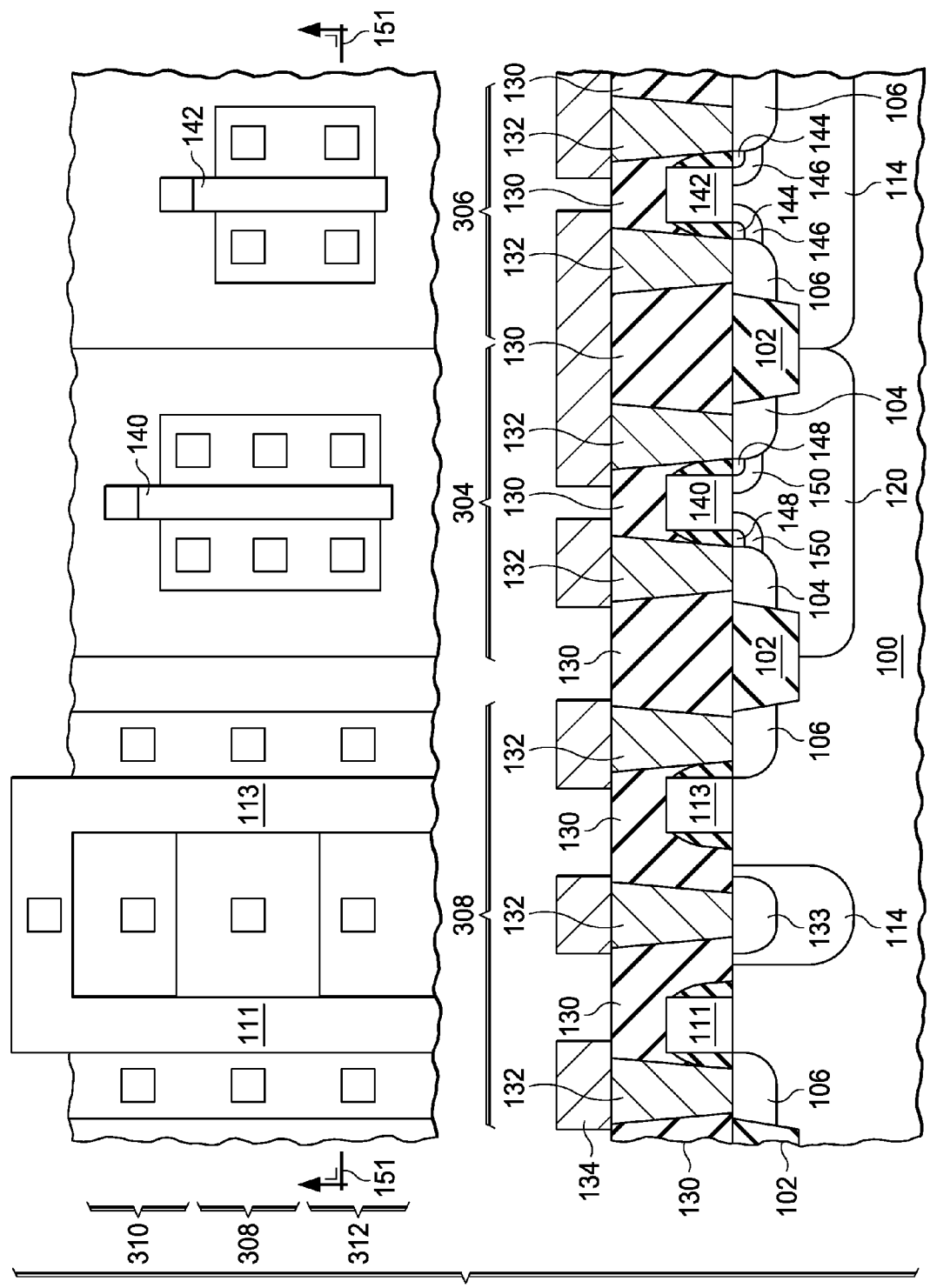

An embodiment NP/NPN ESD device is shown in the cross sections of FIGS. 7A and 7B. First level of interconnect geometries 141 and 145 may be a strips of metal-1 which shorts the emitters of the GS NPN ESD transistors 311 and 312 with the cathodes of the GS NP ESD diodes 308. These metal strips, 141 and 145, may then be connected to Vss through additional levels of metal. First level of interconnect geometry 143 may be a strip of metal-1 which shorts the emitters of the GS NPN ESD transistors 311 and 312 with the anode 310 of the GS NP ESD diode 308 and to the gates 313 of the GS NPN ESD transistors 311 and 312 and the GS NP diode 308.

The cross section in FIG. 7A is along cut line 101 in the top down view and is through the back-to-back NP ESD diodes. The P+ anode diffusion 133 is formed in pwell 114. The N+ cathode diffusions 137 are formed in the p-type substrate 100. The depletion regions of the NP ESD diodes are between the N+ cathode diffusions 137 and the p-type substrate 100.

The cross section in FIG. 7B is along cut line 151 in the top down view and is through the back-to-back NPN bipolar ESD transistors which are connected in parallel with the back-to-back NP ESD diodes.

The NP/NPN ESD device 308 protects the integrated circuit during an ESD strike by shorting ESD current from an I/O pin to Vss or ground. As is evident from FIG. 7, device 308 may be formed at the same time as NMOS 304 and PMOS 306 transistors and at the same time as the PN/PNP ESD device 300 with appropriate changes to the photo resist patterns.

A preferred layout for this embodiment of a NP/NPN ESD device is shown in FIG. 8. The circuit diagram is superimposed on the preferred layout. It is an expanded version of the top down view of the embodiment of the device in FIG. 7. The device consists of two gate separated NP ESD diodes 814 and 816 and four PNP ESD transistors, 806, 808, 810, and 812. PNP ESD transistors 806 and 810 are connected in parallel with PN ESD diode 814 and PNP ESD transistors 808 and 812 are connected in parallel with PN ESD diode 816. The layout has two ESD NP diodes and four NPN ESD transistors, but the preferred layout may have one or more ESD NP diodes and one or more NPN ESD transistors. The ESD NP diodes and the NPN ESD transistors are wired in parallel between and input/output pin and Vss or ground.

A vertical stripe of metal-1 may be formed over the center contacts to short the gate 800 and the collectors, 818 and 822 of the PNP ESD transistors (806, 808, 810, and 812) to the cathode 820 of the NP ESD diodes (814 and 816) and to connect them to Vss or ground. Vertical stripes of metal-1 may also be formed over diffusions 802 and 804 to short the emitters of the NPN ESD transistors to the anodes of the NP ESD diodes and to connect them to an input/output pin.

The first gate separated NP ESD diode 814 is formed between N+ diffusion 802 and the p-substrate 100 which is under the pwell contact 820. The gate 800 electrically isolates the N+ diffusion 802 from the pwell contact 820. The second gate separated ESD NP diode 816 is formed between N+ diffusion 804 and the p-substrate 100 which is under the pwell contact 820. The gate 800 electrically isolates the N+ diffusion 804 from the pwell contact 820.

N+ diffusion 802 forms the emitter of the first NPN ESD transistor 806, the p-substrate 100 under the pwell contact 820 forms the base, and the N+ diffusion 818 forms the collector. N+ diffusion 804 forms the emitter of the second NPN ESD transistor 808, the p-substrate 100 under the pwell contact 820 forms the base, and the N+ diffusion 818 forms the collector. N+ diffusion 802 forms the emitter of the third NPN ESD transistor 810, the p-substrate under the pwell contact 820 forms the base, and the N+ diffusion 822 forms the collector. N+ diffusion 804 forms the emitter of the fourth NPN ESD transistor 812, the p-substrate 100 under the pwell contact 820 forms the base, and the N+ diffusion 822 forms the collector.

The layout provides short ESD current paths for fast turn on and recovery. The gate separated NP ESD diodes, 814 and 816, provide fast turn on time and the four NPN ESD transistors, 806, 808, 810, and 812 provide additional ESD current handling capability plus fast recovery time.

The performance of the NP/NPN ESD protection device may be enhanced by increasing the mobility of the carriers. For example hole mobility in the NP diode may be enhanced by forming SiGe in the P+ pwell contact area 820.

The performance of diode/bipolar ESD protection devices may be additionally improved by enhancing carrier mobility. This may be accomplished by applying the appropriate stress using stress liner (DSL) technology.

As shown in FIGS. 9A (no SiGe) and 9B (SiGe) the performance of PN/PNP ESD devices may be improved by applying compressive stress liner 902 over the PNP ESD transistor regions 301 and 302 to enhance hole mobility and by applying tensile stress liner 900 over the PN ESD diode region 300 to enhance electron mobility. The compressive stress liner 902 also may be used to enhance PMOS transistor performance 306 and tensile stress liner 900 may also be used to enhance NMOS transistor performance 304.

Referring now to FIGS. 10A and 10B the performance of an NP/NPN ESD device may be improved by applying tensile stress liner 900 over the NPN ESD transistor regions 310 and 312 to enhance electron mobility and compressive stress liner 902 over the NP ESD diode region 308 to enhance hole mobility. The compressive stress liner 902 also may be used to enhance PMOS transistor performance 306 and tensile stress liner 900 also may be used to enhance NMOS transistor performance 304.

Those skilled in the art to which this invention relates will appreciate that many other embodiments and variations are possible within the scope of the claimed invention.

What is claimed is:

1. An integrated circuit, comprising:
   a first nwell formed in a p-type substrate;
   a first pwell formed in said p-type substrate where a doping of said first pwell is higher than a doping of said p-type substrate;

a gate dielectric formed on said p-type substrate said first nwell and said first pwell;
an NMOS transistor with an NMOS transistor gate on said gate dielectric over said first pwell;
a PMOS transistor with a PMOS transistor gate on said gate dielectric over said first nwell; and
a diode/bipolar ESD device located in the p-type substrate outside of said first nwell and said first pwell further comprising:
a gate spaced ESD diode with an ESD diode gate on said gate dielectric where said ESD diode gate separates a first doping type diffusion from a second doping type diffusion and where said first doping type diffusion is coupled to a fixed voltage and where said second doping type diffusion is coupled to an input/output pin of said integrated circuit;
a gate spaced ESD bipolar transistor with an ESD bipolar gate on said gate dielectric where said ESD bipolar gate overlies a base of said ESD bipolar transistor with a second doping type and where said ESD bipolar gate separates an emitter diffusion of said ESD bipolar transistor with said first doping type from a collector diffusion of said ESD bipolar transistor with said first doping type;
said gate spaced ESD diode and said gate spaced ESD bipolar transistor are coupled in parallel;
said emitter is coupled to said I/O pin;
said base diffusion is coupled to said fixed voltage;
said collector is coupled to said fixed voltage;
said ESD diode gate is coupled to said fixed voltage;
said ESD bipolar gate is coupled to said fixed voltage;
and wherein a single continuous section of gate material forms both the ESD diode gate and the ESD bipolar gate.

2. The integrated circuit of claim 1 where said diode/bipolar ESD device is a PN/PNP ESD device, where said fixed voltage is Vdd, where said first doping type is p-type, and where said second doping type is n-type, where said ESD diode gate separates a N+ diffusion in a second_nwell from a first P+ diffusion in said second nwell, where said ESD bipolar gate separates said emitter which is a second P+ diffusion in said second nwell from said collector which is a third P+ diffusion in said second nwell, and where said base is the second nwell.

3. The integrated circuit of claim 2 where a depletion region of a PN ESD diode in said PN/PNP ESD device is formed between said first P+ diffusion and said second nwell.

4. The integrated circuit of claim 2 further comprising an isolated pwell formed under said first P+ diffusion and in said second nwell and where a depletion region of a PN ESD diode in said PN/PNP ESD device is formed between said isolated pwell and said second nwell.

5. The integrated circuit of claim 4 where a p-type doping of said isolated pwell is the same as a p-type doping of said pwell.

6. The integrated circuit of claim 2 where said first, said second and said third P+ diffusions contain embedded in SiGe.

7. The integrated circuit of claim 2 where said first P+ diffusion is formed in single crystal silicon, where said second and said third P+ diffusions contain embedded SiGe and where said second P+ diffusion is separated from said first P+ diffusion by a gate material tab.

8. The integrated circuit of claim 2 where compressive etch stop liner overlies said PNP ESD transistor and said PMOS transistor and tensile etch stop liner overlies said PN ESD diode and said NMOS transistor.

9. The integrated circuit of claim 1 where said diode/bipolar ESD device is a NP/NPN ESD device, where said fixed voltage is Vss or ground, where said first doping type is n-type, and where said second doping type is p-type, where said ESD diode gate separates a P+ diffusion in a second pwell from a first N+ diffusion, where said ESD bipolar transistor gate separates said emitter which is a second N+ diffusion from said collector which is a third N+ diffusion, and where said base is the second pwell.

10. The integrated circuit of claim 9 where said P+ diffusion, said first N+ diffusion, said second N+ diffusion and said third N+ diffusions are formed in said second pwell and where a depletion region of a NP ESD diode in said NP/NPN ESD device is formed between said first N+ diffusion and said second pwell.

11. The integrated circuit of claim 2 where said P+ diffusion is formed in said second pwell and where said first N+ diffusion is formed in said p-type substrate and where a depletion region of a PN ESD diode in said PN/PNP ESD device is formed between said p-type substrate and said first N+ diffusion.

12. The integrated circuit of claim 9 where said P+ diffusion contain embedded SiGe and where said P+ diffusion is separated from said third N+ diffusion with a gate material tab.

13. The integrated circuit of claim 9 where tensile etch stop liner overlies said NPN ESD transistor and said NMOS transistor and compressive etch stop liner overlies said NP ESD diode and said PMOS transistor.

14. An integrated circuit, comprising:
a p-type substrate;
a first pwell formed in said p-type substrate;
a first nwell formed in said p-type substrate;
an NMOS transistor with a NMOS transistor gate over the first pwell;
a PMOS transistor with a PMOS transistor gate over the first nwell; and
a diode/bipolar ESD device located in the p-type substrate outside of the first nwell and first pwell further comprising at least one gate spaced ESD diode with a anode with a first doping type and a cathode with a second doping type and at least one gate spaced bipolar ESD transistor with an emitter and a collector with said first doping type and a base with said second doping type and where said gate spaced ESD diode and said gate spaced bipolar ESD transistor are coupled in parallel between a fixed voltage and an input/output pin and wherein a single continuous section of gate material forms both the ESD diode gate and the ESD bipolar gate.

15. The integrated circuit of claim 14 where said diode/bipolar ESD device is comprised of a plurality of gate spaced ESD diodes and a plurality of gate spaced bipolar ESD transistors coupled in parallel between a fixed voltage and an input/out pin.

16. The integrated circuit of claim 14 where said diode/bipolar ESD device is a PN/PNP ESD device comprised of a gate spaced PN ESD diode and a gate spaced PNP ESD transistor coupled in parallel, where said first doping type is p-type, where said second doping type is n-type, and where said fixed voltage is Vdd.

17. The integrated circuit of claim 16 where said emitter is coupled to said input/output pin, where said anode is coupled to said input/output pin, where said cathode is coupled to Vdd, where said collector is coupled to Vdd, where said base is coupled to Vdd, where a gate of said gate spaced PN ESD diode is coupled to Vdd, and where a gate of said gate spaced PNP ESD transistor is coupled to Vdd.

18. The integrated circuit of claim 16 where said anode is a P+ diffusion formed in a second nwell and where said cathode is an N+ diffusion formed in said second nwell and where a depletion region of said PN ESD diode is formed between said P+ diffusion and said second nwell.

19. The integrated circuit of claim 16 where said anode is a P+ diffusion formed in an isolated pwell where said isolated pwell is formed in a second nwell and where said cathode is an N+ diffusion formed in said second nwell and where a depletion region of said PN ESD diode is formed between said isolated pwell and said second nwell.

20. The integrated circuit of claim 14 where said emitter, said collector, and said anode are P+ diffusions containing SiGe and where said cathode is separated from said collector by a gate material tab.

21. The integrated circuit of claim 14 where said emitter and said collector P+ diffusions containing SiGe, said anode is a P+ diffusion containing single crystal silicon and where said cathode is separated from said collector by a first gate material tab and where said anode is separated from said emitter by a second gate material tab.

22. The integrated circuit of claim 16 where a tensile etch stop layer overlies said PN ESD diode and where a compressive etch stop layer overlies said PNP ESD transistor.

23. The integrated circuit of claim 14 where said diode/bipolar ESD device is a NP/NPN ESD device comprised of a gate spaced NP ESD diode and a gate spaced NPN ESD transistor coupled in parallel, where said first doping type is n-type, where said second doping type is p-type, and where said fixed voltage is Vss or ground.

24. The integrated circuit of claim 23 where said emitter is coupled to said input/output pin, where said anode is coupled to Vss or ground, where said cathode is coupled to an input/output pin, where said collector is coupled to Vss or ground, where said base is coupled to Vss or ground, where a gate of said gate spaced PN ESD diode is coupled to Vss or ground, and where a gate of said gate spaced PNP ESD transistor is coupled to Vss or ground.

25. The integrated circuit of claim 23 where said anode is a P+ diffusion formed in a second pwell and where said cathode is an N+ diffusion formed in said second pwell and where a depletion region of said NP ESD diode is formed between said N+ diffusion and said second pwell.

26. The integrated circuit of claim 23 where said anode is a P+ diffusion formed in said second pwell and where said cathode is an N+ diffusion formed in said p-type substrate and where a depletion region of said NP ESD diode is formed between said N+ diffusion and said p-type substrate.

27. The integrated circuit of claim 23 where said anode is a P+ diffusions containing SiGe and where said cathode is separated from said collector by a gate material tab.

28. The integrated circuit of claim 23 where a compressive etch stop layer overlies said NP ESD diode and where a tensile etch stop layer overlies said NPN ESD transistor.

* * * * *